US012656690B2

(12) United States Patent　　(10) Patent No.: US 12,656,690 B2
Gwosch et al.　　(45) Date of Patent: Jun. 16, 2026

(54) OPTICAL APPARATUS, METHOD FOR SETTING A TARGET DEFORMATION, AND LITHOGRAPHY SYSTEM

(71) Applicant: Carl Zeiss SMT GmbH, Oberkochen (DE)

(72) Inventors: Klaus Gwosch, Aalen (DE); Pascal Heller, Giengen (DE); Matthias Manger, Oberkochen (DE); Andreas Koeniger, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 52 days.

(21) Appl. No.: 18/512,298

(22) Filed: Nov. 17, 2023

(65) Prior Publication Data

US 2024/0103381 A1　　Mar. 28, 2024

Related U.S. Application Data

(63) Continuation of application No. PCT/EP2022/063825, filed on May 21, 2022.

(30) Foreign Application Priority Data

May 27, 2021　(DE) ..................... 10 2021 205 426.9

(51) Int. Cl.
G03F 7/00　　(2006.01)

(52) U.S. Cl.
CPC ........ G03F 7/70266 (2013.01); G03F 7/7085 (2013.01)

(58) Field of Classification Search
CPC .. G03F 7/70383; G03F 7/70391; G03F 7/704; G03F 7/70358; G03F 7/70366;
(Continued)

(56) References Cited

U.S. PATENT DOCUMENTS 4,761,073 A * 8/1988 Meltz .................... G01B 11/16
73/800
6,573,978 B1 6/2003 McGuire, Jr.
(Continued)

FOREIGN PATENT DOCUMENTS

DE　　100 46 379 A1　　3/2002
DE　　101 35 806 A1　　2/2003
(Continued)

OTHER PUBLICATIONS

German Office Action, with translation thereof, for corresponding DE Appl No. 10 2021 205 426.9, dated Dec. 2, 2021.
(Continued)

*Primary Examiner* — Christina A Riddle
(74) *Attorney, Agent, or Firm* — Fish & Richardson P.C.

(57) ABSTRACT

An optical apparatus for a lithography system has at least one optical element comprising an optical surface. The optical apparatus also has one or more actuators for deforming the optical surface. The optical element comprises a strain gauge device for determining the deformation of the optical surface. The gauge device comprises: a) at least one path length device for generating a measurement spectrum of a measurement radiation, wherein the path length device comprises a grating device for the measurement radiation and/or a resonator device for the measurement radiation; and/or b) at least one waveguide, wherein the at least one waveguide and/or the at least one grating device and/or the at least one resonator device are formed by the substrate element.

20 Claims, 11 Drawing Sheets

(58) Field of Classification Search

CPC ............. G03F 7/70325; G03F 7/70266; G03F 7/7085; G03F 7/70075; G03F 7/70108; G03F 7/702; G03F 7/70233; G03F 7/70066; G03F 7/70116; G03F 7/70258; G03F 7/7015; G03F 7/70158; G03F 7/70166; G03F 7/70175; G03F 7/70191; G03F 7/70133; G03F 7/70141; G03F 7/70316; G03F 7/70308; G03F 7/70483; G03F 7/70491; G03F 7/705; G03F 7/70508; G03F 7/70516; G03F 7/70525; G03F 7/70533; G03F 7/70541; G03F 7/7055; G03F 7/70558; G03F 7/70566; G03F 7/70575; G03F 7/70591; G03F 7/706; G03F 7/70583; G03F 7/70808; G03F 7/70841; G03F 7/70825; G03F 7/7095; G03F 7/70958; G03F 7/70966; G03F 7/70975; G03F 7/70983; G03F 7/70991; G02B 26/06; G02B 17/0663; G02B 26/0816; G02B 26/0825; G02B 26/0833; G02B 27/0068; G02B 27/0927; G02B 27/18; G02B 5/09

USPC ..... 355/18, 30, 52–55, 67–77; 359/846–849, 359/676–706, 811, 822–826

See application file for complete search history.

(56) References Cited

U.S. PATENT DOCUMENTS

| | | | |
|---|---|---|---|
| 9,411,241 B2 | 8/2016 | Dinger et al. | |
| 2002/0048096 A1 | 4/2002 | Melzer et al. | |
| 2002/0076655 A1* | 6/2002 | Borrelli | B23K 26/0624 |
| | | | 430/945 |
| 2003/0030922 A1 | 2/2003 | Menck | |
| 2005/0232532 A1* | 10/2005 | Wang | G01L 1/246 |
| | | | 385/13 |
| 2006/0132747 A1 | 6/2006 | Singer et al. | |
| 2018/0074303 A1 | 3/2018 | Schwab | |
| 2021/0118654 A1 | 4/2021 | O'Banion, IV et al. | |

FOREIGN PATENT DOCUMENTS

| | | | |
|---|---|---|---|
| DE | 10 2008 009 600 A1 | 8/2009 | |
| EP | 1 614 008 B1 | 1/2006 | |
| TW | 593985 B | 6/2004 | |
| WO | WO 79/00377 A1 | 6/1979 | |

OTHER PUBLICATIONS

International Search Report and Written Opinion for corresponding PCT Appl No. PCT/EP2022/063825, dated Nov. 16, 2022.

"Apparatus and method for monitoring fatigue and debonding of composite structures", Research Disclosure, Kenneth Mason Publications, Hampshire, UK, GB, vol. 662, No. 20, Jun. 1, 2019 (Jun. 1, 2019), p. 560, XP007147467, ISSN: 0374-4353.

Price, T.R. et al.: "Self-Aware Telescope: FY19 Optical Systems Technology Line-Supported Program", Massachusetts Institute of Technology Lincoln Laboratory, Project Report LSP-277 (2019).

Mueller, U. et al.: "Fiber optic Bragg grating sensors for high-precision structural deformation control in optical systems", Proc. of SPIE vol. 6167, 61670 A-1 bis A-12 (2006).

Ackermann et al., "High-speed femtosecond UV laser writing of low-loss waveguides in fused silica," Optics Letters, 2025, 50(8):2506-2509.

Office Action in Taiwanese Appln. No. 111119429, mailed on Dec. 15, 2025, 28 pages (with English translation).

Search Report in Taiwanese Appln. No. 111119429, mailed on Dec. 4, 2025, 8 pages (with English translation).

* cited by examiner

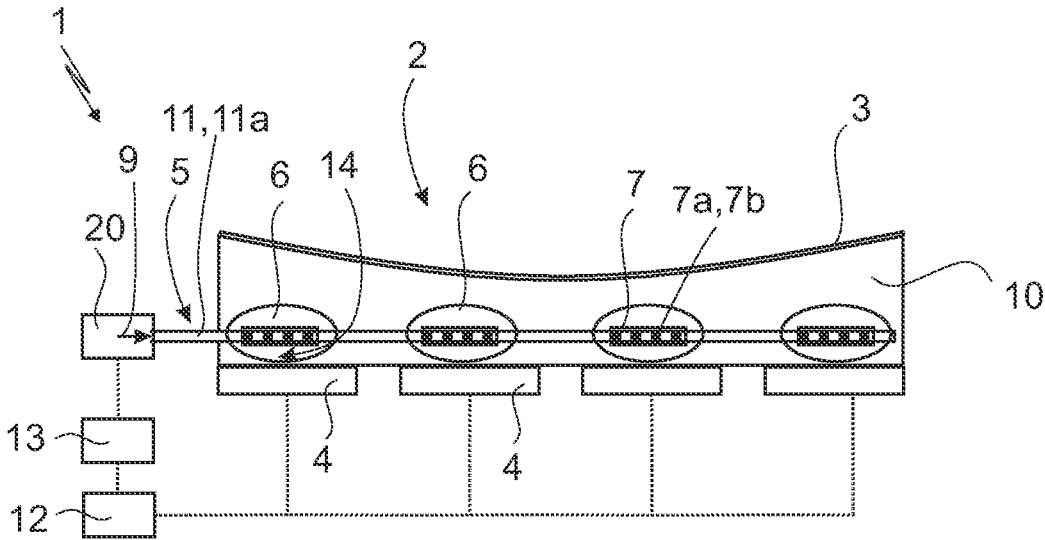
_Fig. 3_
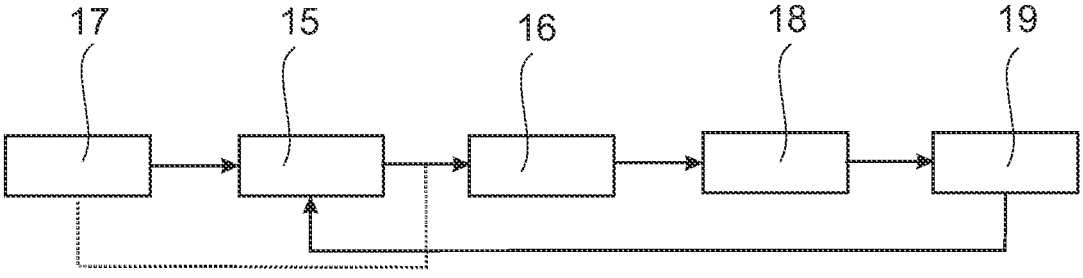
_Fig. 3A_

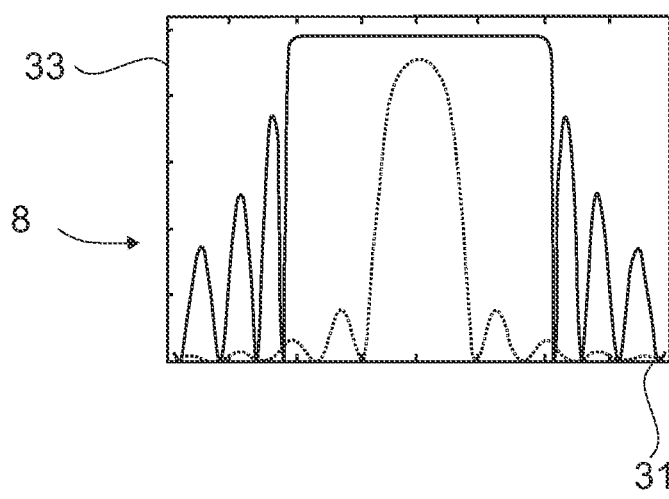
_Fig. 10_
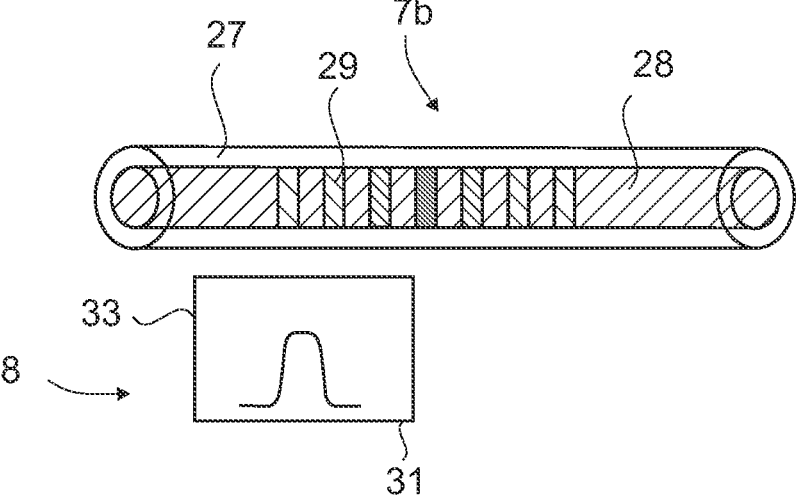
_Fig. 11_
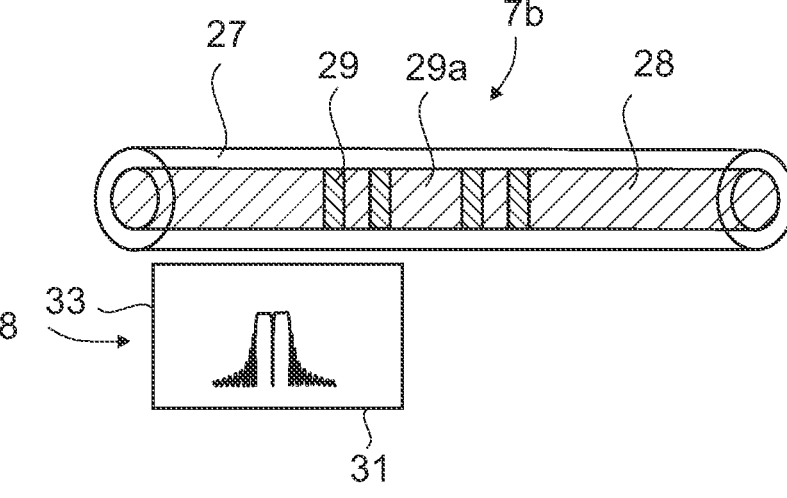
_Fig. 12_

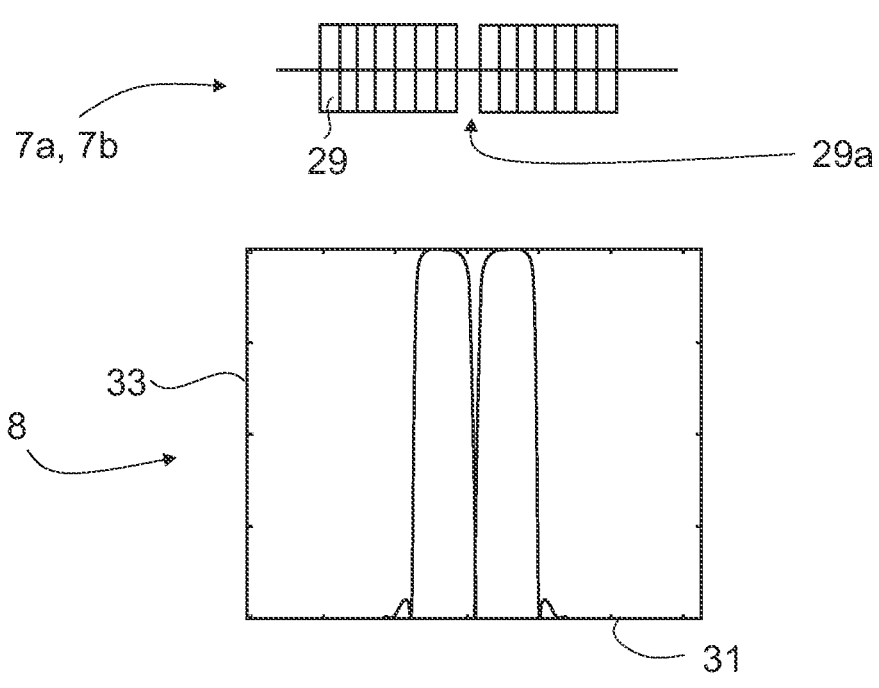
7a, 7b
29
29a
33
8
31
_Fig. 15_
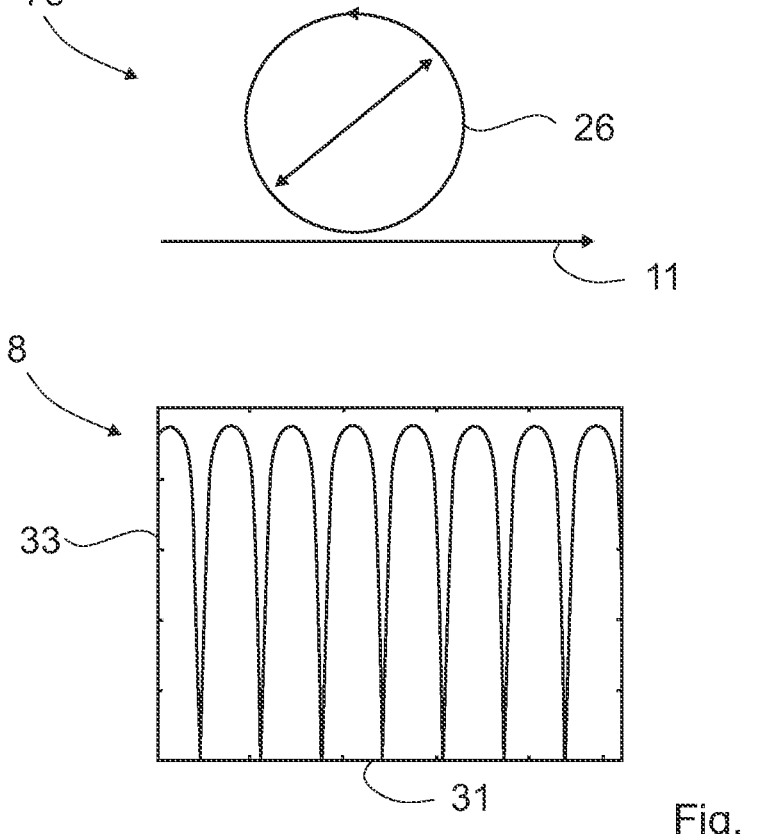
7c
26
11
8
33
31
_Fig. 16_

OPTICAL APPARATUS, METHOD FOR SETTING A TARGET DEFORMATION, AND LITHOGRAPHY SYSTEM

CROSS-REFERENCE TO RELATED APPLICATIONS

The present application is a continuation of, and claims benefit under 35 USC 120 to, international application PCT/EP2022/063825, filed May 21, 2022, which claims benefit under 35 USC 119 of German Application No 10 2021 205 426.9, filed May 27, 2021. The entire disclosure of each these applications is incorporated by reference herein.

FIELD

The disclosure relates to an optical apparatus for a lithography system, having at least one optical element comprising an optical surface and having one or more actuators for deforming the optical surface. The disclosure further relates to a method for setting a target deformation of an optical surface of an optical element for a lithography system via one or more actuators. Moreover, the disclosure relates to a lithography system, such as a projection exposure apparatus for semiconductor lithography, having an illumination system with a radiation source and an optical unit which comprises at least one optical element. Furthermore, the disclosure relates to a production method for an optical element for a lithography system.

BACKGROUND

Optical elements for guiding and shaping radiation in projection exposure apparatuses are known. In the known optical elements, a surface of the optical element frequently guides and shapes the light waves incident on the optical element. Therefore, to form an exact wavefront with desired properties, precise control of the shape of the surface can be desirable.

It is known to integrate optical elements into optical apparatuses, which have actuators for force production in order to shape, in a targeted manner, the optical surface that interacts with the light waves.

It is known to predict the effect of the actuators on the optical surface, for example on the basis of modeling. However, influences neglected in the modeling may weaken a predictive power of the model.

Known optical apparatuses can have the issue that maintaining the target deformation as exactly as possible is decisive in relation to meeting the ever increasing demands for increased precision, while the measures for exactly setting the target deformation, known to this end, are insufficient.

SUMMARY

The present disclosure seeks to develop an improved optical apparatus, such as an optical apparatus that can facilitate precise shaping or precise setting of a target deformation of an optical surface.

The present also disclosure seeks to develop an improved method for setting a target deformation of an optical surface, such as a method that can facilitate precise and reliable shaping or precise setting of a target deformation of the optical surface.

The present disclosure also seeks to develop an improved lithography system, such as a lithography system that can facilitate forming precisely shaped wavefronts of a projection radiation.

In an optical apparatus according to the disclosure for a lithography system, at least one optical element comprising an optical surface and one or more actuators for deforming the optical surface are present. Provision is made for the optical element to comprise a strain gauge device for determining the optical surface, wherein the strain gauge device comprises at least one path length device for generating a measurement spectrum of a measurement radiation, wherein the path length device comprises a grating device for the measurement radiation and/or a resonator device for the measurement radiation, and/or at least one waveguide; wherein the at least one waveguide and/or the at least one grating device and/or the at least one resonator device are formed by the substrate element.

Within the scope of the disclosure, a strain may also be understood to mean a contraction and/or compression.

Provision can be made for the strain gauge device to comprise at least one path length device for generating a measurement spectrum of a measurement radiation, wherein the path length device comprises a grating device for the measurement radiation and/or a resonator device for the measurement radiation, wherein the at least one grating device and/or the at least one resonator device are formed by the substrate element.

Provision can be made for the strain gauge device to comprise at least one waveguide, wherein the at least one waveguide is formed by the substrate element.

An optical apparatus according to the disclosure can monitor the deformation of the optical surface via the strain gauge device. In this context, the strain gauge device can be part of the optical element and hence information about deformations of the optical surface can be collected and measured in significant spatial and/or functional proximity to the optical element via the strain gauge device since the optical surface is part of the optical element.

Further, the mechanical deformation of the optical surface can serve to shape the optical surface and/or set a target deformation.

Monitoring the actual deformation of the optical surface or information regarding the actual deformation of the optical surface can provide knowledge about the shape of the optical surface and hence about its effect on light or radiation guided and shaped by the optical surface and hence provide information, at least indirectly, about the effect, obtained at the optical surface, of the actuators configured to deform the optical surface.

For example, provision can be made for the strain gauge device to be designed in such a way that the strain is measured at a plurality of defined locations within and/or on the optical surface.

Provision can be made for the strain gauge device to comprise structures which are applied directly on or into the at least one optical element and/or optical units and which are utilizable in terms of their optical effect as a sensor in order to read an actual state of a deformation of the optical element. For example, the structures can be waveguides which allow input coupling and/or guidance of light.

By way of example, the at least one actuator can be in the form of a piezoelectric and/or electrostrictive actuator.

In a development of the optical apparatus according to the disclosure, provision can be made for the strain gauge device to be configured to determine a strain in at least one measurement region of the optical element, the at least one measurement region being arranged in such a way that a strain of the measurement region is determined by a deformation of the optical surface.

A relation that is as unique as possible, optionally a bijective relation, between the deformation of the optical surface and the strain of the measurement region leads to the strain of the measurement region being determined by the deformation of the optical surface. Accordingly, it can be desirable for the at least one measurement region is arranged in and/or on the optical element in such a way that the prescribed, optionally bijective relation arises. In this way, it is possible to determine particularly reliable information about the actual deformation of the optical surface from the strain of the at least one measurement region.

To achieve this, provision is made in the described embodiment for the strain gauge device to be configured to determine the strain in the at least one measurement region. Thus, the above-described embodiment yields an information flow about the actual deformation of the optical surface, which starts from the optical surface and goes to the strain of the measurement region and from the strain of the measurement region goes to the strain gauge device. The reverse sequence yields an information flow about the deformation of the optical surface to be set, which starts from the at least one actuator and goes to the deformation of the optical surface, optionally via the strain of the measurement region.

Within the scope of the disclosure, the measurement region should be understood to mean that region of the optical apparatus in which the actual strain, in particular a change in the actual strain vis-à-vis an original strain, is measurable with a sufficient degree of accuracy.

In a development of the optical apparatus according to the disclosure, provision can be made for the strain gauge device to be at least partly arranged within the at least one measurement region.

An at least partial, optionally complete physical arrangement of the strain gauge device in the at least one measurement region is desirable because strains and/or distortions in the at least one measurement region can be transferred to the strain gauge device by way of mechanical coupling. This can yield immediate and direct access to the strain actually prevalent within the measurement region to be examined.

As an alternative or in addition thereto, provision can be made for the strain gauge device to be arranged at a distance from the measurement region and not to be arranged in physical contact with the latter. By way of example, the strain gauge device may comprise a camera which determines the strain of the measurement region by way of a change in an external contour of the measurement region when the latter is strained. Such a strain gauge device would not be at least partly arranged within the at least one measurement region but an information flow relating to the strain of the measurement region would be ensured.

Provision can be made for the optical element to comprise an optical surface formed continuously and/or in one piece and for the optical element to not be a field facet mirror in particular. As a result, the optical surface can at least approximately form a free-form surface.

According to an embodiment of the disclosure the strain gauge device comprises at least one path length device for generating a measurement spectrum of a measurement radiation.

To this end, provision can be made for the path length device to exhibit or have a characteristic and strain-dependent reflection spectrum and/or a characteristic and strain-dependent transmission spectrum.

If the strain gauge device is configured to generate a measurement spectrum of a measurement radiation, this facilitates a particularly precise and efficient signal evaluation in the strain gauge device. Firstly, information items or the desired information can be registered, and in particular transferred, particularly well via a measurement radiation and secondly spectra or spectral signals are ideally suited to a precise determination by measurement.

It can be desirable for the path length device provided to this end is configured to form path lengths of different components of the measurement radiation differently and/or to form path differences between different components of the measurement radiation, and optionally to subsequently make the parts of the measurement radiation that traveled different path lengths interfere. In this context and within the scope of the disclosure, the term path length device should not be understood as restricted exclusively to this effect.

By way of example, the path length device can be formed by a refractive index variation within an optical medium that collates the measurement radiation. This yields a different optical path length for various components of the measurement radiation.

Provision can be made for the measurement radiation used within the scope of the disclosure to have a wavelength from 100 nm to 10 000 nm, such as 300 nm to 3000 nm, for example 1500 nm to 1600 nm.

Provision can be made for the at least one measurement spectrum to have wavelengths from 100 nm to 10 000 nm, such as 300 nm to 3000 nm, for example 1500 nm to 1600 nm.

The provision can be made for the strain gauge device to have a readout device for optical readout of the path length devices.

Provision can be made for the readout device to comprise at least the following constituent parts:

a measurement radiation source for forming the measurement radiation which is radiated on the path length device via the waveguide;

a detection device, in particular a spectrometer device, via which the measurement radiation transmitted and/or reflected by the at least one path length device is detected and converted into an electrical signal; and an evaluation computing device for carrying out digital algorithms.

In this case, the detection device can be configured to implement various readout methods. By way of example, the detection device can be configured to carry out both spectroscopic methods and interferometric methods.

The spectroscopic methods include, in particular, conventional spectrometry methods, dual comb spectroscopy methods and/or Pound-Drever-Hall-Lock methods.

The aforementioned readout methods are provided for readout of the measurement spectrum of the path length device and for conversion of the latter into a optionally digital, electrical signal.

Alternatively or in addition, provision can be made for the readout device to comprise at least the following constituent parts:

a tunable narrowband measurement radiation source for forming the measurement radiation in various narrowband wavelength ranges, as a result of which a optionally broad wavelength band is able to be swept or scanned, the measurement radiation being able to be radiated on the path length device via the waveguide; and a detection device, in particular a photodiode, via which the measurement radiation transmitted and/or reflected by the at least one path length device is able to be detected in time-resolved fashion and able to be converted into an electrical signal; and an evaluation computing device for carrying out digital algorithms.

Further, the readout device can be configured to carry out an interferometric method via an unbalanced Mach-Zehnder interferometer.

Optical and/or electronic devices used to this end can be implemented both on the optical surface of the optical element to be measured, optionally as a photonic integrated circuit, and/or as an external structure.

A path length device can be desirable in that the optical path length is able to be influenced by the geometric structure of the strain gauge device. In particular, provision can be made for the difference in the path lengths to be traveled by the components of the measurement radiation to be altered when the path length device is strained. As a result, it is possible to draw conclusions about the strain present.

According to an embodiment of the disclosure the path length device comprises a grating device for the measurement radiation.

A path length difference between the different components of the measurement radiation can be generated in systematic and simple fashion by way of a grating device, in particular an optical grating.

In particular, the grating device can be a line grating, optionally formed by a refractive index variation. By systematically arranging regions with a high and low refractive index in the form of alternating lines, which is known as a line grating, it is possible to obtain a path length difference for many individual sub-components of the measurement radiation along an extent of the grating device. As it were, it is not only two large halves of the measurement radiation that are exposed to different path lengths but the measurement radiation is divided in many small parts in accordance with the grating length and the grating period, which parts are assigned two groups of refractive indices and hence in turn yield two components of the measurement radiation which have a different path length.

According to an embodiment of the disclosure the path length device comprises a resonator device for the measurement radiation.

A resonator device as a path length device can be desirable because resonant frequencies of the resonant device may depend on a geometric extent of the resonator device. If there is a change in the geometric extent of the resonator device as a result of the measuring device being strained, it is possible to draw particularly precise conclusions about the actual strain.

In a development of the optical device according to the disclosure, provision can be made for the optical element to comprise a substrate element, on which the optical surface is arranged and/or formed, and for the strain gauge device to be at least partly arranged in and/or on the substrate element.

The substrate element can be formed as a solid and/or single-piece main body of the optical element, optionally made of glass and/or silicon oxide.

Optical elements where a substrate element is found below the optical surface are desirable because the optical surface is stable against twisting and/or vibrations.

In this case, it can be desirable for the strain gauge device to be at least partly arranged within and/or on the substrate element if the latter is mechanically tightly coupled to the optical surface.

By way of example, provision can be made for the optical surface to be formed as patterning and/or a coating on the substrate element, and/or by the substrate element.

The strain gauge device which measures a strain of the substrate element accordingly allows precise and reliable conclusions to be drawn about a deformation of the optical surface.

If the strain gauge device is engulfed in the substrate element, the former can be mechanically coupled particularly tightly to the substrate element and thus permit a particularly accurate measurement of the strain of the substrate element. By contrast, an arrangement of the strain gauge device on the substrate element is desirable in that there is no need to change the structure, and hence mechanical stability, of the substrate element for the introduction of the strain gauge device, the latter rather being arranged externally on the substrate element.

Rather it may be desirable for the strain gauge device to be partly arranged within the substrate element, that is to say parts of the strain gauge device are located outside of the substrate element, since as a result only relevant parts of the strain gauge device have to be arranged in or on the substrate element.

It may be desirable for the strain gauge device to be arranged completely within or on the substrate element since this may yield a particularly compact structure of the optical apparatus.

Provision can be made for the strain gauge device, in addition or as an alternative to the path length device, to comprise further active sensor structures.

In particular, provision can be made for the active sensor structures to serve as a cavity for the measurement radiation and for a mode structure of the cavity to be changeable on account of a strain of the measurement region.

According to an embodiment of the disclosure the path length device comprises at least one waveguide.

The presence of at least one waveguide facilitates the supply of the measurement radiation to the at least one path length device.

In this context, provision can be made for the at least one waveguide to comprise an optical fiber, a light channel and/or, in a puristic embodiment, a free beam guidance of the measurement radiation. In this context, an embodiment of the path length device as a grating device is advantageous in that the grating device may be formed as a refractive index variation in the waveguide, as a result of which this yields a particularly compact structure of the strain gauge device. In particular, such an embodiment allows the path length device or the grating device to be arranged in relevant regions of the optical element while the measurement radiation is transmitted through the at least one waveguide between the relevant regions of the optical element.

By way of example, the waveguide may comprise a light channel which is monolithically integrated into the substrate element of the optical element.

Provision can be made for a plurality of path length devices to be arranged along a single waveguide and/or a branched waveguide network.

In an advantageous development of the optical apparatus according to the disclosure, provision can be made for the strain gauge device to comprise a plurality of path length devices, the at least one waveguide guiding the measurement radiation, optionally in succession, to the plurality of path length devices.

Such an embodiment facilitates the monitoring of a plurality of relevant regions of the optical element using only one waveguide.

Provision can be made for the plurality of path length devices to be formed as grating devices.

In an advantageous development of the optical apparatus according to the disclosure, provision can be made for the at least one grating device to be in the form of a fiber Bragg grating.

Forming the at least one grating device as a fiber Bragg grating is advantageous in that a change in the strain of the grating device can be monitored particularly advantageously by way of the fiber Bragg grating. A grating period of the fiber Bragg grating is changed if the grating device is strained, as a result of which a back-reflected fiber bandwidth and, in particular, a central wavelength of the back-reflected fiber bandwidth change on the basis of the strain experienced by the fiber Bragg grating.

Further, a notch in a transmission spectrum of the measurement radiation through the fiber Bragg grating changes as a result of the fiber Bragg grating being strained and changes on the basis of the fiber Bragg grating strain, the notch being formed at the location of the central wavelength of the fiber bandwidth and with the width of the fiber bandwidth.

Further, determining and analyzing the relative position of the reflected central wavelength and/or the relative position of the notch in the transmission spectrum allows particularly precise conclusions to be drawn about the change in the grating period of the fiber Bragg grating and hence about the mechanical and/or geometric strain experienced by the fiber Bragg grating.

Provision can be made for the path length device to be formed as a simple fiber Bragg grating along the waveguide.

Further, provision can be made for the path length device to have a complex geometry. In particular, provision can be made for the path length to be formed as a π fiber Bragg grating and/or as a combination with the resonator device, in particular with at least one ring resonator.

Further, provision can be made for the path length device to be formed as a combination of a fiber Bragg grating and/or a π fiber Bragg grating and/or a two-dimensional resonator device and/or a three-dimensional resonator device.

In particular, provision can be made for the path length device to be configured to selectively reflect and/or actively imitate measurement radiation in a certain wavelength range and/or filter the measurement radiation in a certain wavelength range out of a transmitted spectrum of the measurement radiation.

Further, provision can be made for the path length device to be formed in such a way that changes in the strain and/or temperature changes lead to changes in the reflected and/or transmitted spectrum.

Provision can be made for the path length devices to be connected to a readout device, in particular a spectrometer device, by way of an optical connection, in particular by way of a waveguide.

Accordingly, provision can be made for structures in the strain gauge device to be embodied in such a way that a refractive index variation, in particular in the form of a Bragg grating and/or fiber Bragg grating, is introduced into the waveguide along the propagation direction of the measurement radiation.

Provision can be made for the optical fiber with the fiber Bragg grating to be adhesively bonded onto or into the optical element.

Provision can be made for the optical fiber with the fiber Bragg grating to be melted into or onto the optical element, in particular the substrate element, via a low-melting soldering glass and/or direct bonding technology.

Fiber Bragg grating sensors for measuring strain are known from the prior art for the purposes of monitoring wind turbines, pipelines, bridges and buildings, for example.

In an advantageous development of the optical apparatus according to the disclosure, provision can be made for the at least one waveguide to be in the form of an optical fiber.

Optical fibers as a waveguide offer the advantage of reliably transmitting coupled-in radiation even when curved. The optical fibers may be curved, in particular in the case of strain caused by the at least one actuator.

Further, optical fibers have low light losses within the scope of light guidance or a high light-guiding efficiency, and high-quality optical fibers can be obtained cheaply.

Provision can be made for the at least one waveguide to be formed as a light channel, in the case of which the measurement radiation experiences total-internal reflection at the walls of the light channel, as a result of which light waves of the measurement radiation are guided within the waveguide.

In an advantageous development of the optical apparatus according to the disclosure, provision can be made for the at least one waveguide and/or the at least one grating device and/or the at least one resonator device to be formed by the substrate element.

An embodiment of the path length device, that is to say in particular of the at least one grating device and/or the at least one resonator device, via the substrate element is advantageous in that the sought-after tight mechanical coupling between the path length device and the substrate element can be obtained directly by way of such a monolithic structure. As a result, a strain of the substrate element can advantageously be determined precisely and reliably.

In this context, it is further advantageous if the at least one waveguide is formed, optionally monolithically formed, by the substrate element. This yields a particularly compact structure of the strain gauge device and/or of the optical element.

Provision can be made for the waveguide and/or the at least one path length device to be manufactured monolithically in a special layer of the optical element.

Further, provision can be made for the at least one waveguide and/or the at least one path length device to be manufactured monolithically directly in the substrate element of the optical element.

Monolithic manufacturing methods offer advantages over adhesive-based integration methods. In particular, creepage movements, flows, volume changes and an outgassing of the adhesive can be avoided as these represent problems when the adhesive is used for a long-term stability and a functionality of the optical apparatus, in particular the optical surface if optical coatings are present, in particular within a lithography system.

A further advantage of a monolithic manufacture of at least a part of the strain gauge device lies in the avoidance of stresses which may be formed when various materials interact, for example a material of the substrate element, the adhesive and a material of the optical fiber. Such stresses in the interaction may arise, for example, as a result of temperature changes if the used materials have different coefficients of thermal expansion at the same time.

By way of example, such stresses may lead to errors in the determined values of the strain of the measurement region and/or of the deformation of the optical surface. Further, a monolithic integration of the strain gauge device or the waveguides and/or the path length devices in the optical element is advantageous in that fewer different materials are brought together, possible stresses can be reduced and a more homogeneous coefficient of thermal expansion can be obtained.

Further, adhesive-induced problems do not occur as a result of adhesive bonds being dispensed with.

Possible methods for a monolithic manufacture are known, for example, from the production of photonic integrated circuits and/or the writing of waveguides in glass or glass ceramic substrates.

To form parts of the strain gauge device and/or the at least one waveguide and/or the at least one path length device, provision can be made for these to be manufactured by direct writing by way of a local change in the refractive index. In particular, provision can be made for the local change in the refractive index to be formed via a write radiation, for example in an ultraviolet spectral range and/or using ultrashort laser pulses, optionally with a pulse duration of a few femtoseconds; and/or ion beams; and/or electron beams.

Further, in the manufacture of parts of the strain gauge device, the at least one waveguide and/or the at least one path length device can be applied near the surface using lithographic techniques such as exposing, developing, etching or applying material, for example.

While lithographic techniques are suitable for regions close to the surface, in particular, the direct writing methods provide the option of structuring the at least one waveguide and/or the at least one path length device in three dimensions, in particular for monolithic manufacture. In particular, this can be carried out far below a surface of the optical element, in particular below the optical surface.

Provision can be made for structures, for example the at least one waveguide and/or the at least one path length device, to be manufactured at depths of more than 10 µm, such as more than 100 µm, such as more than 1 mm, such as more than 10 mm.

For a strain measurement near the surface, provision can be made for structures, for example the at least one waveguide and/or the at least one path length device, to be manufactured at a depth of 5 µm to 20 µm, optionally 10 µm.

Provision can be made for the substrate element to be formed from an $SiO_2$—$TiO_2$ glass. Such a glass has a very low coefficient of thermal expansion and is therefore particularly suitable for performing the substrate element underlying the optical surface.

In an advantageous development of the optical apparatus according to the disclosure, provision can be made for a plurality of measurement regions of the strain gauge device to be formed at different depths in the substrate element and/or for at least one of a plurality of measurement regions to be arranged in a strain-neutral plane of the substrate element.

Provision can be made for the strain gauge device to have only one measurement region.

Measuring the strain of the substrate element at different depths allows particularly precise conclusions to be drawn about a distortion and/or strain, actually present, of the substrate element as a whole. This allows the deformation actually experienced by the surface to be predicted particularly precisely.

To be able to separate effects of mechanical strain, which are optionally caused by the at least one actuator, and/or strains and distortions caused by external effects, for example a change in temperature, from one another, it is advantageous if at least one of the plurality of measurement regions of the strain gauge device is arranged in a strain-neutral plane of the substrate element. Under an isotropic expansion, which may be caused by a change in temperature for example, the strain-neutral plane experiences an expansion while it remains undistorted when actuated by the at least one actuator.

Provision can be made for the strain gauge device to be configured to measure the changes in temperature and/or a temperature of the at least one measurement region.

Provision can be made for the grating device to have a temperature-dependent central wavelength or Bragg wavelength $\lambda_B$.

According to formula (1), the central wavelength arises as twice the product of the grating period $\Lambda$ and the effective refractive index $n_{eff}$ of the grating device.

$$\lambda_B = 2n_{eff}\Lambda \tag{1}$$

Formula (2) describes a change in the central wavelength or Bragg wavelength $\lambda_B$ in the case of the strain or in the case of a change in the length l of the grating device caused by the strain and in the case of a change $\Delta T$ in the temperature T.

$$\Delta\lambda_B = 2\left[\Lambda\frac{\partial n_{eff}}{\partial l} + n_{eff}\frac{\partial\Lambda}{\partial l}\right]\Delta l + 2\left[\Lambda\frac{\partial n_{eff}}{\partial T} + n_{eff}\frac{\partial\Lambda}{\partial T}\right]\Delta T \tag{2}$$

It is evident that even without a force-induced strain, that is to say in the case $\Delta l=0$, there can be a change in the central wavelength or Bragg wavelength $\lambda_B$ on account of a change $\Delta T$ in the temperature T.

In the context of the disclosure, a strain-neutral plane should be understood to mean a section of the substrate element formed from strain-neutral fibers. In particular, the term plane may also relate to a strain-neutral section of the substrate element that is curved in space.

To separate the measurement of the strain and the temperature, provision can be made for the measurement regions and/or the path length devices to be introduced at different depths in the optical element. In particular, provision can be made for a structure of the strain gauge device to be designed in such a way that, for the purposes of separating mechanical strain and temperature expansion, measurement regions or active sensor structures are introduced in part close to and in part far away from the strain-neutral fiber or the strain-neutral plane of the optical element.

Provision can be made for the production methods illustrated below to be used for the purposes of arranging or forming the active sensor structures or path length devices or measurement regions near the strain-neutral plane.

The waveguide and/or the path length device can be formed or attached at a greater depth in the optical element or substrate element, and in particular close to the strain-neutral plane, via joining methods such as, for example, optical contact bonding, welding, in particular laser welding, adhesive bonding and/or connecting with a low-melting glass, in particular a soldering glass, optionally within a groove, by virtue of the formation of the waveguides or the path length devices or measurement regions being followed by two partial optical units being connected by the joining method.

If the active sensor structures are formed near the surface, these may also be formed by lithographic methods, for example as are used in the manufacture of photonic integrated chips.

Further, provision can be made for the active sensor structures, in particular the waveguides, the path length devices or the measurement regions thereof, to be formed by direct writing of the structures into the optical surface and/or the substrate element via high-energy, optionally pulsed light and/or particle beams. This is advantageous in that an advantageously tight mechanical coupling is present between the substrate element and the measurement region as a result of a direct monolithic form. Further, the path length device can be generated without significant changes in the mechanical properties of the substrate element below the optical surface.

In an advantageous development of the optical apparatus according to the disclosure, provision can be made for a closed-loop control device with a closed loop to be provided for the purposes of setting a target strain of the measurement region via the at least one actuator, with an actual strain of the measurement region determined by the strain gauge device being taken into account.

By using the closed loop in the closed-loop control device, the attainment of the target strain of the measurement region can be reached particularly reliably and precisely by taking into account the information about the actual strain as determined by the strain gauge device.

In this case, coupling of the at least one waveguide or the at least one waveguide structure to a radiation source of the measurement radiation and/or a readout device, in particular readout electronics, for example in the form of the spectrometer device, can be implemented by way of a free beam optical unit, a melting of the optical fiber to glass structures of the substrate element, an adhesive bonding of a mechanical fiber holder to the optical element, in particular to the substrate element, and/or an application of a photonic integrated chip with a light source and/or a detector.

In an advantageous development of the optical apparatus according to the disclosure, provision can be made for the closed-loop control device to be configured for the purposes of setting a target deformation of the optical surface via the at least one actuator, with the actual strain of the measurement region determined by the strain gauge device being taken into account.

An actual deformation of the optical surface in fact present can be deduced on the basis of the precisely determined actual strain of the measurement region. By way of example, modeling on the basis of a finite element method can be provided to this end.

In this case, it is advantageous for the closed-loop control device to be configured to set the target deformation of the optical surface via the at least one actuator on the basis of the determined actual strain of the measurement region, with it being possible to take into account a modeled relationship between the determined actual strain and actual deformation of the optical surface in fact present.

By way of example, in the case of a relative position of a measurement region near the optical surface, such a modeled relationship may consist of the actual deformation of the optical surface and the actual strain of the measurement region being directly identical.

Provision can be made for the measurement region, at least in part, to be arranged in or at the optical surface as this yields an advantageous identical relationship between the determined actual strain of the measurement region and the actual deformation of the optical surface, as a result of which the target deformation of the optical surface is able to be set particularly easily by the closed-loop control device and the at least one actuator on the basis of the determined actual strain of the measurement region.

Provision can be made for the strain gauge device to be configured to monitor a shape behavior of the optical element. To this end, provision can be made for the strain of the measurement region to be measured and for a suitable force which adjusts the strain of the measurement region to a target value to be produced by the actuators within a closed loop.

In an advantageous development of the optical apparatus according to the disclosure, provision can be made for the closed-loop control device to be configured to correct at least one temperature-induced and/or strain-induced deviation of the actual deformation from the target deformation of the optical surface.

To ensure and/or increase a performance of the optical element, it is advantageous if the optical surface has a constant shape in the form of the target deformation over time, in particular during use as intended.

It is advantageous if deviations from the target deformation are correctable via the optical apparatus. During intended use, such deviations may arise due to mechanical distortions, for example within the scope of assembly, and/or temperature changes.

Advantageously, the closed-loop control device is configured to correct such deviations via the at least one actuator, as a result of which an advantageously high performance of the optical surface arises.

Provision can be made for the strain gauge device to be embodied in such a way that a temperature can also be measured, in addition to the strain, in a plurality of measurement regions of the optical element.

In the case of the fiber Bragg gratings known from the prior art, both the changes in the strain and in the temperature lead to a change in the reflected and/or transmitted measurement spectrum.

To separate the strain from the temperature, provision can be made for at least two path length devices to be arranged close together, with the path length devices having different geometries such that the influence of a change of temperature and of a strain on the two path length devices is different.

To separate the strain from the temperature, provision can be made for at least two path length devices to be arranged close together, the path length devices having differently strong mechanical couplings to the substrate element of the optical element. As a result, the influences of the strain on the two path length devices are different.

To separate the strain from the temperature, provision can be made for a path length device to be arranged in a birefringent waveguide, in particular in a polarization-maintaining fiber. In this case, strain can be separated from temperature by way of a separate readout of two polarization directions.

Via a polarization-maintaining optical fiber, it is possible to separate or decouple those influences on the deformation of the optical surface which can be traced back to a change in temperature from those influences on the deformation of the optical surface which can be traced back to a strain and/or distortion of the optical element. This facilitates an even more accurate and precise control of the deformation or the precise shaping of the optical surface since the various influencing factors on the shape of the optical surface can be addressed and/or removed separately from one another.

A separation of temperature-induced influences is particularly advantageous since temperature variations on the optical surface, in particular during use in EUV lithography systems, may represent one of the largest disturbances in relation to the deformation of the optical element. In particular, the temperature of the optical surface or the optical element may vary between 20° C. and 40° C. during operation.

To separate the temperature from the strain, provision can be made for path length devices and separate temperature sensors to be provided, via which the strain signals of the path length device can be temperature corrected.

To separate the strain from the temperature, provision can be made for a symmetry of the path length device breaking as a result of strain, for example in the case of a ring resonator, while the symmetry is maintained in the case of a temperature change. As a result, both measured quantities can be separated.

To separate the strain from the temperature, provision can be made for a plurality of path length devices to be arranged in such a way within the optical element that some of the path length devices are located close to the strain-neutral fibers, in particular a strain-neutral plane, while others, by contrast, are located further away from the strain-neutral fibers. Signals of the path length devices close to the strain-neutral fibers are influenced predominantly by the changes in temperature, whereas path length devices arranged further away from the strain-neutral fibers are influenced both by changes in temperatures and changes in strain.

An influence of the temperature and/or of the strain can be separated by a model or calibration, and both quantities can be determined. In particular, this method can also be used if both the temperature and information about the strain or only one of the two quantities is/are intended to be determined.

Temperature-induced strains may arise as a consequence of a thermal load due to an increased light output during use in a projection exposure apparatus. This may lead to a deformation of the optical element. To compensate this effect, the use of the optical apparatus, in particular in the form of a deformable mirror, may be advantageous.

Provision can be made for the strain gauge device to be configured to determine both temperature-induced and strain-induced changes in the shape of the optical element. Provision can be made for both effects to be compensated via the actuators, which facilitates the use of materials with a finite coefficient of thermal expansion or a greater coefficient of thermal expansion to what is known from the prior art. This may save costs.

In an advantageous development of the optical apparatus according to the disclosure, provision can be made for a plurality of measurement regions to be arranged on the optical element in such a way that deformations of the optical surface that are relevant to an optical effect caused by the optical element are measurable.

In particular, it is advantageous if those deformations that are relevant to an optical effect of the optical element can be corrected by the optical apparatus. By way of example, the optical effect can consist in the formation of an image representation.

Provision can be made for a plurality of strain gauge devices to be present as part of the optical apparatus. If a plurality of strain gauge devices are present, provision can be made for the plurality of strain gauge devices to share other constituent parts of the optical apparatus.

Provision can be made for a plurality of strain gauge devices and/or a plurality of path length devices to be attached to the optical element in such a way that the changes in shape of the optical element that are relevant to the optical imaging are able to be measured. Actuator forces used to compensate the change in shape can be determined by way of a calibration and/or an analytical model and/or a numerical model and/or a trained neural network.

Accordingly, it may be advantageous if the measurement regions are arranged near a point of intersection of an optical axis with the optical surface in order, in particular, to precisely and reliably control regions close to the axis in terms of their shape or deformation.

In an advantageous development of the optical apparatus according to the disclosure, provision can be made for a computing device to be provided to determine an actual deformation of the optical surface and/or a suitable force of the at least one actuator for setting a target deformation of the optical surface from the determined actual strain of the at least one measurement region.

In particular, provision can be made for the closed-loop control device and the computing device to form one unit, for example in the form of a computer.

To determine the force that the actuator needs to apply to bring about a defined and/or desired target deformation of the optical surface it is possible to take account of mechanical properties of the optical surface and/or of the substrate element optionally underlying the optical surface and, in particular, to implement these in the form of a solid physical model. A computing device can be particularly advantageous for the optionally complex calculations used to this end.

Further, the computing device may be configured to determine a model of the mechanical relationship between the actual strain in the at least one measurement region and the actual deformation of the optical surface.

The presence of a computing device is further advantageous since the underlying calculations and/or model forming may have to be carried out anew in the case of changing circumstances, for example in the case of a temperature increase and/or a change in operating conditions. In particular, provision can be made for the model-like calculations to be implementable at regular intervals.

In an advantageous development of the optical apparatus according to the disclosure, provision can be made for a plurality of the actuators, optionally all actuators, to be each assigned a measurement region which comprises, optionally exclusively comprises, an effective region of the respective actuator.

In the context of the disclosure, the effective region of the at least one actuator should be understood to mean that region of the optical apparatus in which a strain caused by the at least one actuator is able to be measured by the strain gauge device with a sufficient accuracy.

Optionally, provision can be made for each actuator to respectively have a single, optionally path-connected effective region, with effective regions, in particular of adjacent actuators, also being able to overlap.

In the context of the disclosure, each actuator optionally has an effective region, with a measurement region optionally being assigned to the effective region of an actuator.

Sampling the individual effective regions of the actuators if a plurality of actuators are present is advantageous in that the actuators can be individually driven in effect-related fashion in order to obtain a precise form of the deformation of the optical surface.

Alternatively or in addition, provision can be made for a plurality of effective regions to fall within one measurement region, as a result of which actuators can be driven in groups, for example in effect-related fashion.

To this end, provision can be made for the measurement regions to be virtually interconnected by virtue of individual measurement regions being merged to form a larger measurement region. By way of example, faster setting of the optical surface can be obtained as a result since the actuators are not driven on an individual basis but are driven in groups.

By contrast, individual actuation of the individual actuators can allow a more precise actuation of the optical surface in terms of spatial detail.

Provision can be made for at least one path length device and/or at least one strain gauge device to be arranged and configured per actuator in order to predominantly measure an effective region of the respective actuator, the measured effective region being at least approximately independent from a strain input of one or more adjacent actuators.

Provision can be made in particular for the measurement region to be arranged in such a way that the latter experiences at least virtually exclusively strains caused by the actuator whose effective region is assigned to the measurement region.

In an advantageous development of the optical apparatus according to the disclosure, provision can be made for the strain of the at least one measurement region and/or vibrations of the optical surface to be determinable regularly, optionally continuously, by the strain gauge device.

A regular, optionally continuous determination of the actual strain of the at least one measurement region facilitates monitoring of the actual deformation of the optical surface, and hence of the performance of the optical element, over time with virtually no gaps.

In particular, dynamic changes in the deformations of the optical surface can be registered as a result. By way of example, vibrations of the optical surface include such dynamic changes.

Accordingly, the strain gauge device is configured to regularly, optionally continuously determine the strain of the at least one measurement region and/or vibrations of the optical surface.

Provision can be made for the strain gauge device to be configured to measure vibrations of the optical element and/or of the optical surface, which vibrate at a frequency of 0 Hz (static case) to 1000 Hz, optionally 1 Hz to 200 Hz. Such frequencies may have a particularly negative influence on the functionality of the optical element, and can be avoided by the optical apparatus.

To this end, provision can be made for the strain gauge device to be configured to measure the strain at a measurement frequency of 1 kHz to 100 kHz, such as 3 kHz to 30 kHz, such as 5 kHz to 20 kHz. Such a measurement frequency is suitable for particularly reliable measurement of the vibrations at the aforementioned frequencies.

Provision can be made for the strain gauge device to be configured to monitor a vibrational behavior of the optical element or optical apparatus. To this end, provision is made for the strain to be measured continuously and/or in quick succession.

In an advantageous development of the optical apparatus according to the disclosure, provision can be made for one or more measurement regions to be arranged on and/or in the optical element in such a way that one or more vibration modes of the optical surface and/or of the optical element are determinable.

Provision can be made for an amplitude and/or a phase of the vibration mode to be determined when determining the at least one vibration mode. In particular, provision can be made for a whole vibration trajectory to be measured.

To measure one or more vibration modes of the optical surface and/or the optical element, it is advantageous if one or more measurement regions are arranged at regions in and/or on the optical element which experience particularly strong strain signals during a vibration occurrence on the optical surface. As a result, vibration modes with particularly high signal-to-noise ratio are rendered determinable.

It may be advantageous if provision is made for the actual strain of the at least one measurement region to be determined at a sampling frequency which corresponds to at least one Nyquist frequency in relation to the vibration frequency of the vibration mode to be determined.

As a result, the vibration of the optical surface and/or of the optical element in the vibration mode to be examined can advantageously be determined precisely and reliably.

An overall mass of the optical units increases disproportionately in the case of larger optical units and unchanging properties with respect to an inherent stiffness of the optical unit, which may lead to an increase in costs. Accordingly, the described embodiment of the optical apparatuses is particularly advantageous if the optical element is in the form of a thin mirror. The natural vibrations of such a thin mirror can be calmed via the optical apparatus since the latter comprises a strain gauge device which allows a measurement of a deformation of the optical surface and/or of the thin mirror in situ.

Accordingly, provision can be made for one or more strain gauge devices and/or path length devices and/or measurement regions to be attached on or in the optical element to be measured, in such a way that a finite number of vibration modes of the optical element can be measured.

In the method according to the disclosure for setting a target deformation of an optical surface of an optical element for a lithography system via one or more actuators, provision is made for an actual deformation of the optical surface to be determined by virtue of at least one actual strain of at least one measurement region of the optical element being determined.

The method according to the disclosure offers the advantage that the success of the effect of the at least one actuator on the optical surface can be verified directly by virtue of determining a mechanical effect, that is to say the actual strain of the at least one measurement region of the optical element.

In this way, it is possible to obtain a particularly accurate prediction, as the latter is based on empirical measurements, of the true actual deformation of the optical surface after the target deformation has been set and the at least one actuator has developed its effect.

Provision can be made for the shape of the optical surface to be determined by measuring the actual strain at discrete sampling points, the entire shape of the optical surface being determined via a model and/or an interpolation.

In this case, provision can be made for the sampling points of the strain measurement to be formed by a plurality of measurement regions which are optionally arranged so as to be separate from one another.

In an advantageous development of the method according to the disclosure, provision can be made for the at least one measurement region to be chosen in such a way that the actual deformation of the optical surface can be deduced from the actual strain.

If there is a resilient functional relationship between the actual strain of the measurement region and the actual strain of the optical surface, verifying the effect of the at least one actuator is made easier. By way of example, provision can be made for significant mechanical coupling to be present between the at least one measurement region and the optical surface such that strains and/or distortions of the at least one measurement region are transferred, at least indirectly, to the optical surface.

Alternatively or in addition, provision can be made for the at least one measurement region to correspond with at least one clearly delimitable region of the optical surface such that the actual deformation of the clearly restricted region of the optical surface is able to be modeled by the actual strain of the at least one measurement region.

Further, provision can be made for the at least one measurement region to be arranged in or on the optical surface, as a result of which deductions relating to the actual deformation of the optical surface from the strain of the at least one measurement region can advantageously be made particularly easily.

In an advantageous development of the method according to the disclosure, provision can be made for the strain gauge device to be arranged in such a way that at least one measurement spectrum is influenced in at least one path length device as a result of the actual strain of the at least one measurement region.

If an optical path length of a measurement radiation is changed as a result of the strain of the measurement region, the strain gauge device can be in the form of an optical device. In particular, if a measurement spectrum of a path length device is influenced by the actual strain, a measurement principle of the strain gauge device can be traced back to an interference measurement which advantageously facilitates precise evaluations, in some fields even unmatched precise evaluations, of strains.

The measurement spectrum of the path length device should be understood to mean the spectrum with which the measurement radiation is reflected and/or transmitted by the wave direction.

In an advantageous development of the method according to the disclosure, provision can be made for the actual strain to be determined by detecting at least one measurement spectrum of at least one measurement radiation.

The measurement radiation can be of broadband or narrowband form.

By using a broadband measurement radiation, it is possible to measure a plurality of measurement spectra in parallel and/or a single measurement spectrum over an advantageously broad spectral range.

Provision can be made for the measurement spectrum to be detected via a scanning method, optionally by virtue of a narrowband measurement radiation with only a narrow wavelength range, in particular a laser radiation, being radiated on the path length device, and a relative spectral position of the narrow wavelength range being varied over time, for example by way of a tunable laser, as a result of which a broad wavelength band is optionally swept or scanned, and an intensity of the transmitted and/or reflected measurement radiation being measured in time-resolved fashion, for example via a photodiode, synchronously with the variation of the wavelength range, and the measurement spectrum in the optionally broad wavelength band being determined by comparing the detected intensity of the measurement radiation with the wavelength of the measurement radiation at different times.

Such a scanning method for determining the measurement spectrum is particularly reliable and precise.

In particular, the use of the measurement radiation allows the use of optical detection methods and/or readout methods within the scope of the method.

In an advantageous development of the method according to the disclosure, provision can be made for the path length device to be formed by a grating device and/or a resonator device.

Grating devices or optical gratings and/or optical resonators are particularly suitable for determining very small path length differences of individual components of the measurement radiation. If the actual strain of the measurement region changes, it is possible to bring about changes in the geometric extent of the grating device and/or the resonator device, as a result of which the optical properties, in particular the resonance properties and/or the reflecting properties, of the grating device and/or the resonator device change. This allows the changed geometry and hence the actual strain of the measurement region present to be determined very precisely.

Provision can be made for the grating device to be integrated in the resonator device. This can facilitate an even more precise measurement of the strain.

Further, provision can be made for the resonator device to comprise at least one ring resonator which is at least partly formed from an optical fiber.

Further, provision can be made for the ring resonator to be at least partly formed from an optical fiber which comprises at least one fiber Bragg grating. As a result, a full width at half maximum of the fiber bandwidth and/or of the notch can be reduced by up to a factor of 10.

In an advantageous development of the method according to the disclosure, provision can be made for the force of the at least one actuator used to set a target deformation of the optical surface to be determined and/or applied, optionally in a closed loop, on the basis of the determined actual deformation of the optical surface.

A suitable force of the at least one actuator for obtaining the desired target deformation can be set particularly accurately on the basis of the determined actual deformation of the optical surface, for example be set empirically. In particular, the method avoids actuation of the optical surface being based purely on forward modeling of the effect of the force of the at least one actuator.

Provision can be made for correction terms for an actuator position to be calculated from the determined quantities and the deviations thereof from the target values for the optical apparatus. Provision can be made for the corrections to be calculated in such a way that the deformation of the optical surface is closer to the target deformation.

Should a vibration behavior of the optical element be calmed, provision can be made for the actuators to be driven in such a way that the vibration amplitudes of those vibration frequencies which are relevant to the optical imaging or the optical effect of the optical element are reduced.

In an advantageous development of the method according to the disclosure, provision can be made for the actual strain to be determined in one or more measurement regions in at least one substrate element on which the optical surface is arranged and/or formed.

If one or more substrate elements underlie the optical surface, it is advantageous to arrange the measurement regions in the one or more substrate elements since the actual strain of the underlying substrate element allows particularly precise conclusions to be drawn about the actual deformation of the optical surface in fact present in the case of strong mechanical coupling between the optical surface and the underlying substrate element.

In this case, provision can be made for the optical surface to be formed as patterning and/or a coating on and/or in the substrate element and/or for the optical surface to be formed in the form of patterning by the substrate element itself. If the optical surface is formed as a coating of the substrate element, advantageously strong mechanical coupling between the substrate element and the optical surface arises as a result of the coating adhering to the substrate element, as a result of which modeling the actual deformation of the optical surface in fact present by determining the present actual strain of the measurement region can be assumed to be possible.

In an advantageous development of the method according to the disclosure, provision can be made for the actual strain to be determined synchronously in a plurality of measurement regions.

As a result of determining the actual strain synchronously in a plurality of measurement regions, it is possible to capture an advantageously comprehensive picture of the strains and distortions of the optical element.

Provision can be made for the actual strain to be determined in quick temporal succession, for example in a multiplexing method, in a plurality of measurement regions.

In particular, provision can be made for the plurality of measurement regions to capture actual strains in different, optionally linearly independent spatial axes. As a result, the actual strain of the optical element can advantageously be measured in three-dimensional space.

This applies even more if measurement regions are grouped in groups of three, for example, with the three measurement regions of the group of three being oriented along the spatial axes. In this case, provision can be made for such groups of three measurement regions to be arranged systematically and homogeneously in or on the optical element, in particular the substrate element.

In an advantageous development of the method according to the disclosure, provision can be made for a shift of the at least one measurement spectrum to be detected.

Spectral shifts of spectra can be determined advantageously precisely by way of interference methods. Therefore, it is advantageous if the measurement of the actual strain is traced back to a measurement of the shift of the at least one measurement spectrum.

Provision can be made for the path length device to be designed in such a way that a frequency shift in the case of a strain caused by an intended use of the at least one actuator is 1 pm to 1 nm, such as 5 pm to 500 pm, for example 20 pm to 100 pm.

Provision can be made for the strain gauge device and/or the path length device to be designed in such a way that a strain resolution is 1 am to 1 nm, such as 5 am to 1 pm, for example 0.5 fm to 50 fm.

In particular, provision can be made for a shift of the reflected central wavelength of the fiber bandwidth of the grating device, in particular of the fiber Bragg grating, to be detected and/or for a relative position of the central wavelength of a notch in the transmission spectrum of the measurement radiation to be detected by the grating device, in particular the fiber Bragg grating.

Such a reduction of the relevant range of the measurement spectrum to the central wavelength of the reflected fiber bandwidth and/or of the notch in the transmission spectrum facilitates a quick and precise determination of the shift. Further, the relative position of the central wavelength depends directly on a grating period of the grating device, and hence on a geometric feature of the grating device and hence in turn on the actual strain of the surroundings of the grating device mechanically decoupled from the grating device, that is to say of the measurement region.

A synchronous measurement of the actual strain in a plurality of measurement regions may be advantageous since this allows the deformation of the optical surface by the at least one actuator to be controlled and formed in a targeted and coordinated fashion.

By detuning resonant frequencies and/or central wavelengths or Bragg wavelengths of the individual path length devices, it is possible to form the measurement spectra of the individual path length devices in distinguishable fashion. In particular, this allows a plurality of path length devices to be read by way of a single waveguide or only a few waveguides.

Provision can be made for more than one, such as more than ten, such as more than 50, for example more than 100 path length devices to be read simultaneously and/or virtually simultaneously.

In an advantageous development of the method according to the disclosure, provision can be made for the actual strain of the at least one measurement region and/or vibrations of the optical surface to be determined regularly, optionally continuously, by the strain gauge device.

A regular, optionally continuous determination of the actual strain facilitates the detection of dynamic strains, for example vibrations and/or tremors of the optical surface. As a result hereof, a correct behavior or a correct shape of the optical surface can be verified and/or adapted and/or actuated at regular intervals.

A continuous determination, that is to say determination with the best possible time resolution, is advantageous in that even very short-lived changes in the actual strain can be detected and optionally corrected.

If a reaction time of the at least one actuator is insufficient to correct such a short-lived deviation of the actual strain from the target strain, monitoring or detecting such deviations may nevertheless be advantageous.

In an advantageous development of the method according to the disclosure, provision can be made for one or more vibration modes of the optical surface and/or of the optical element to be determined.

Detecting an excitation of one or more vibration modes of the optical surface, in particular natural vibrations of the optical surface, is advantageous in that, in the case where the vibration modes are excited, these may be damped, in particular actively damped, for example by way of the at least one actuator. As a result, deteriorations of an optical effect of the optical element can be reduced or prevented.

Monitoring one or more vibration modes in the case of a very thin substrate element is particularly advantageous since an optical surface arranged on such a substrate element can tend to vibrate with particularly large amplitudes and in disadvantageous frequency ranges.

In an advantageous development of the method according to the disclosure, provision can be made for the respective actual strain in a plurality of measurement regions to be determined at different depths in the substrate element and/or for the actual strain to be determined in a strain-neutral plane of the substrate element in at least one of a plurality of measurement regions.

Measuring the actual strain in different layers of the substrate element facilitates a uniform representation or capture of the actual mechanical strain present in the substrate element.

If furthermore at least one measurement region is arranged in a strain-neutral plane of the substrate element, it is possible to distinguish or separate a temperature-induced influence on the strain of the overall substrate element from those strains which for example are caused by mechanical distortions within the scope of assembly and/or as a result of mechanical strains caused by the at least one actuator.

Shape changes and/or vibrations and/or temperatures of the optical element determined according to the method can be used in many different ways.

Provision can be made for a malfunction of the optical apparatus to be determined on the basis of the determined actual strain and/or the determined actual deformation. If a malfunction is present when using the optical apparatus in a lithography system, provision can optionally be made for a current process of the lithography system to be terminated and/or for the error to be transmitted to subsequent processing steps. Further, provision can be made for a responsible party for the machine to be notified for the purposes of analyzing the problem.

The lithography system according to the disclosure, in particular a projection exposure apparatus for semiconductor lithography, comprises an illumination system with a radiation source and an optical unit which comprises at least one optical element. According to the disclosure, provision is made for at least one optical apparatus according to the disclosure to be provided, with at least one of the optical elements being an optical element of the at least one optical apparatus. Alternatively or in addition, provision is made for at least one of the optical elements to comprise an optical surface which is deformable using a method according to the disclosure.

Within the scope of the disclosure, a deformability via the method according to the disclosure should be understood to mean an adjustability of the deformation of the optical surface.

The lithography system according to the disclosure offers the advantage that the optical effect of the optical elements or optical surface is precisely controlled and precisely adjustable, as a result of which it is possible to obtain advantageously high imaging qualities when using the projection exposure apparatus.

In particular, the optical apparatus is suitable for use in a projection lens of an EUV projection exposure apparatus.

The optical apparatus is particularly suitable for use in an EUV projection exposure apparatus and/or a DUV projection exposure apparatus and/or a UV projection exposure apparatus.

In particular, provision can be made for at least one of the optical components or mirrors of the projection exposure apparatus to be part of the optical apparatus.

The production method for an optical element for a lithography system comprising an optical surface, wherein the optical surface is deformable by one or more actuators, wherein the optical element comprises a strain gauge device for determining the deformation of the optical surface, wherein the strain gauge device comprises at least one path length device for generating a measurement spectrum of a measurement radiation, wherein the path length device comprises a grating device for the measurement radiation and/or a resonator device for the measurement radiation, and/or at least one waveguide, includes forming of the at least one waveguide and/or the at least one grating device and/or the at least one resonator device by the substrate element.

In a first embodiment of the disclosure, if the strain gauge device comprises at least one path length device for generating a measurement spectrum of a measurement radiation, wherein the path length device comprises a grating device for the measurement radiation and/or a resonator device for the measurement radiation, the at least one grating device and/or the at least one resonator device can be formed by the substrate element.

In a second embodiment of the disclosure, if the strain gauge device comprises at least one waveguide, wherein the at least one waveguide can be formed by the substrate element.

In an advantageous development of the production method according to the disclosure, the formation of the at least one waveguide and/or the at least one grating device and/or the at least one resonator device by the substrate element can be accomplished by direct writing by way of a local change in the refractive index.

In an advantageous development of the production method according to the disclosure, the local change in the refractive index can be formed via a write radiation, for example in an ultraviolet spectral range and/or using ultrashort laser pulses, optionally with a pulse duration of a few femtoseconds, in particular 1 to 15 femtoseconds, and/or ion beams, and/or electron beams.

In an advantageous development of the production method according to the disclosure, the at least one waveguide and/or the at least one path length device can be applied near a surface using lithographic techniques such as exposing, developing, etching or applying material.

In an advantageous development of the production method according to the disclosure, the at least one waveguide and/or the at least one path length device is being structured in three dimensions, in particular for monolithic manufacture and/or far below a surface of the optical element, in particular below the optical surface.

It can be advantageous if at least one of the optical elements of the lithography system according to the disclosure is produced by the production method according to the disclosure or one of its described developments.

It can be advantageous if the optical element of the method for setting a target deformation of an optical surface of an optical element according to the disclosure is produced by the production method according to the disclosure or one of its described developments.

Features described in conjunction with one of the subjects of the disclosure, specifically given by the optical apparatus according to the disclosure, the method according to the disclosure, the lithography system according to the disclosure or the production method according to the disclosure, are also advantageously implementable for the other subjects of the disclosure. Likewise, advantages specified in conjunction with one of the subjects of the disclosure can also be understood in relation to the other subjects of the disclosure.

Additionally, reference is made to the fact that terms such as "comprising", "having" or "with" do not exclude other features or steps. Furthermore, terms such as "a(n)" or "the" which indicate single steps or features do not preclude a plurality of features or steps and vice versa.

However, in a puristic embodiment of the disclosure, provision can also be made for the features introduced in the disclosure using the terms "comprising", "having" or "with" to be listed in exhaustive fashion. Accordingly, in some embodiments, one or more lists of features can be considered complete within the scope of the disclosure, for example when respectively considered for each claim. By way of example, an aspect of the disclosure can consist exclusively of the features mentioned in claim 1.

Labels such as "first" or "second", etc. are predominantly used for reasons of distinguishability between respective apparatus or method features and are not necessarily intended to indicate that features involve one another or are related to one another.

Exemplary embodiments of the disclosure are described in greater detail below with reference to the drawing.

The figures in each case show preferred exemplary embodiments in which individual features of the present disclosure are illustrated in combination with one another. Features of an exemplary embodiment are also able to be implemented independently of the other features of the same exemplary embodiment, and may readily be combined accordingly by a person skilled in the art to form further expedient combinations and sub-combinations with features of other exemplary embodiments.

In the figures, functionally identical elements are provided with the same reference signs.

BRIEF DESCRIPTION OF THE DRAWINGS

In the drawings

FIG. 3 shows a schematic representation of a section through a possible embodiment of the optical apparatus according to the disclosure;

FIG. 3A shows a schematic block diagram-type representation of an embodiment of the method according to the disclosure;

FIG. 10 shows a schematic representation of a possible measurement spectrum of a grating device;

FIG. 11 shows a schematic representation of a further possible embodiment of a grating device;

FIG. 12 shows a schematic representation of a further possible embodiment of a grating device;

FIG. 15 shows a schematic representation of a further possible embodiment of the grating device;

FIG. 16 shows a schematic representation of a further possible embodiment of the resonator device;

DETAILED DESCRIPTION

Figure 1:
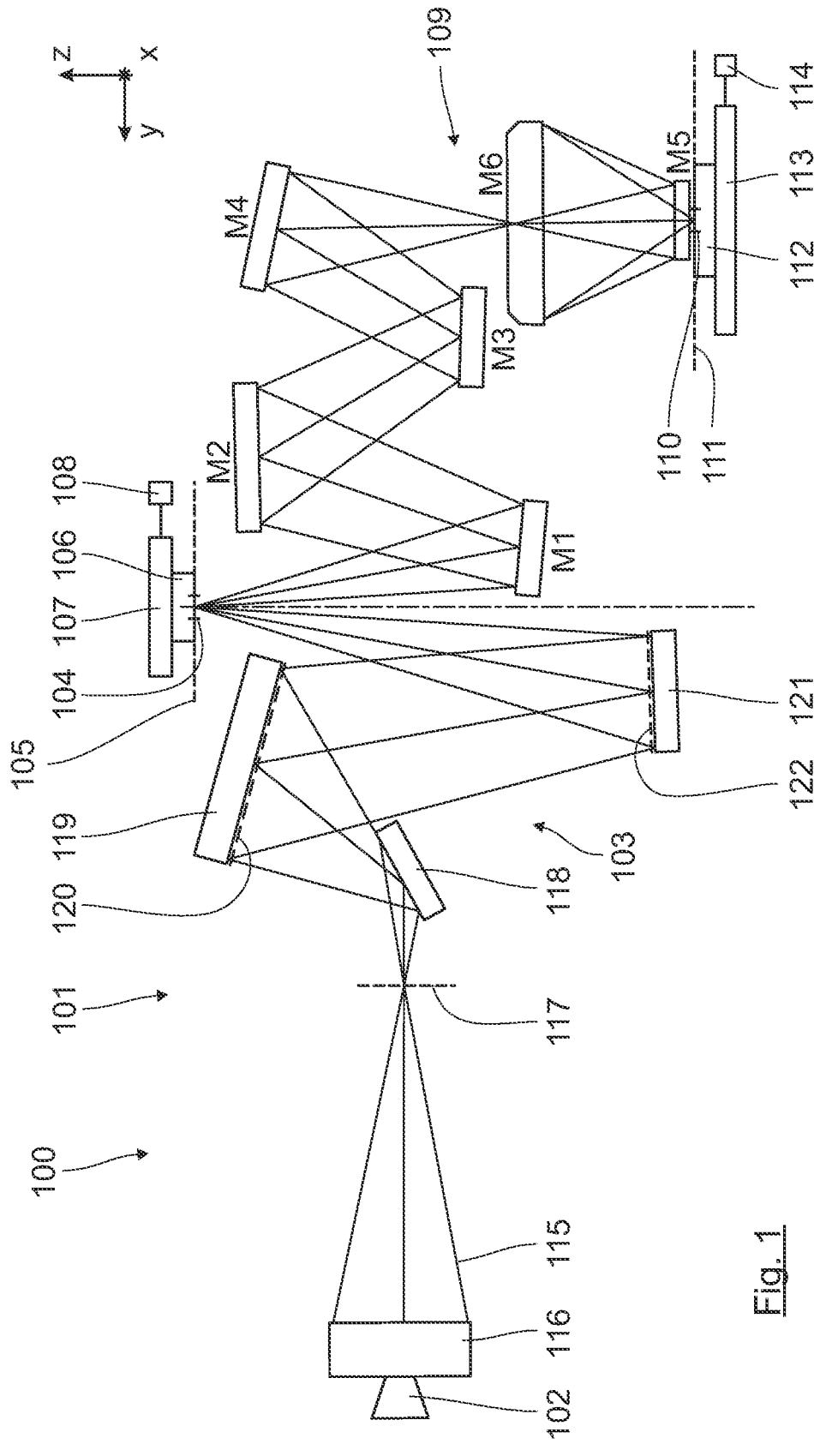
FIG. 1 shows a meridional section of an EUV projection exposure apparatus.

With reference to FIG. 1, certain components of a microlithographic EUV projection exposure apparatus 100 as an example of a lithography system are initially described below in exemplary fashion. The description of the basic structure of the EUV projection exposure apparatus 100 and of the components thereof should not be interpreted restrictively here.

An illumination system 101 of the EUV projection exposure apparatus 100 comprises, besides a radiation source 102, also an illumination optical unit 103 for the illumination of an object field 104 in an object plane 105. Here, a reticle 106 arranged in the object field 104 is exposed. The reticle 106 is held by a reticle holder 107. The reticle holder 107 is displaceable by way of a reticle displacement drive 108, in particular in a scanning direction.

In FIG. 1, a Cartesian xyz-coordinate system is plotted to aid the explanation. The x-direction runs perpendicularly into the plane of the drawing. The y-direction runs horizontally and the z-direction runs vertically. In FIG. 1, the scanning direction runs along the y-direction. The z-direction runs perpendicular to the object plane 105.

The EUV projection exposure apparatus 100 comprises a projection optical unit 109. The projection optical unit 109 serves for imaging the object field 104 into an image field 110 in an image plane 111. The image plane 111 runs parallel to the object plane 105. Alternatively, an angle between the object plane 105 and the image plane 111 that differs from 0° is also possible.

A structure on the reticle 106 is imaged onto a light-sensitive layer of a wafer 112 arranged in the region of the image field 110 in the image plane 111. The wafer 112 is held by a wafer holder 113. The wafer holder 113 is displaceable by way of a wafer displacement drive 114, in particular along the y-direction. The displacement, on the one hand, of the reticle 106 by way of the reticle displacement drive 108 and, on the other hand, of the wafer 112 by way of the wafer displacement drive 114 can take place in such a way as to be synchronized with one another.

The radiation source 102 is an EUV radiation source. The radiation source 102 emits EUV radiation 115, in particular, which is also referred to as used radiation or illumination radiation below. In particular, the used radiation 115 has a wavelength in the range between 5 nm and 30 nm. The radiation source 102 can be a plasma source, for example an LPP source ("laser produced plasma") or a GDPP source ("gas discharged produced plasma"). It can also be a synchrotron-based radiation source. The radiation source 102 can be a free electron laser (FEL).

The illumination radiation 115 emerging from the radiation source 102 is focused by a collector 116. The collector 116 may be a collector with one or more ellipsoidal and/or hyperboloidal reflection surfaces. The at least one reflection surface of the collector 116 can be impinged with the illumination radiation 115 with grazing incidence (GI), i.e., with angles of incidence greater than 45°, or with normal incidence (NI), i.e., with angles of incidence less than 45°. The collector 116 can be structured and/or coated, firstly, for optimizing its reflectivity for the used radiation 115 and, secondly, for suppressing extraneous light.

Downstream of the collector 116, the illumination radiation 115 propagates through an intermediate focus in an intermediate focal plane 117. The intermediate focal plane 117 can represent a separation between a radiation source module, having the radiation source 102 and the collector 116, and the illumination optical unit 103.

The illumination optical unit 103 comprises a deflection mirror 118 and, arranged downstream thereof in the beam path, a first facet mirror 119. The deflection mirror 118 can be a plane deflection mirror or, alternatively, a mirror with a beam-influencing effect that goes beyond the purely deflecting effect. Alternatively or in addition, the deflection mirror 118 can be in the form of a spectral filter which separates a used light wavelength of the illumination radiation 115 from extraneous light with a wavelength deviating therefrom. If the first facet mirror 119 is arranged in a plane of the illumination optical unit 103 that is optically conjugate to the object plane 105 as a field plane, it is also referred to as a field facet mirror. The first facet mirror 119 comprises a multiplicity of individual first facets 120, which are also referred to below as field facets. Only a few of these facets 120 are illustrated in FIG. 1 in exemplary fashion.

The first facets 120 can be in the form of macroscopic facets, in particular as rectangular facets or as facets with an arcuate peripheral contour or a peripheral contour of part of a circle. The first facets 120 may be in the form of plane facets or alternatively as convexly or concavely curved facets.

As known for example from DE 10 2008 009 600 A1, the first facets 120 themselves may also be composed in each case of a multiplicity of individual mirrors, in particular a multiplicity of micromirrors. The first facet mirror 119 can in particular be formed as a microelectromechanical system (MEMS system). For details, reference is made to DE 10 2008 009 600 A1.

Between the collector 116 and the deflection mirror 118, the illumination radiation 115 travels horizontally, that is to say along the y-direction.

In the beam path of the illumination optical unit 103, a second facet mirror 121 is arranged downstream of the first facet mirror 119. If the second facet mirror 121 is arranged in a pupil plane of the illumination optical unit 103, it is also referred to as a pupil facet mirror. The second facet mirror 121 can also be arranged at a distance from a pupil plane of the illumination optical unit 103. In this case, the combination of the first facet mirror 119 and the second facet mirror 121 is also referred to as a specular reflector. Specular reflectors are known from US 2006/0132747 A1, EP 1 614 008 B 1 and U.S. Pat. No. 6,573,978.

The second facet mirror 121 comprises a plurality of second facets 122. In the case of a pupil facet mirror, the second facets 122 are also referred to as pupil facets.

The second facets 122 can likewise be macroscopic facets, which can for example have a round, rectangular, or hexagonal periphery, or alternatively be facets made up of micromirrors. In this regard, reference is likewise made to DE 10 2008 009 600 A1.

The second facets 122 can have plane or alternatively convexly or concavely curved reflection surfaces.

The illumination optical unit 103 consequently forms a doubly faceted system. This basic principle is also referred to as fly's eye integrator.

It can be advantageous to arrange the second facet mirror 121 not exactly in a plane that is optically conjugate to a pupil plane of the projection optical unit 109.

With the aid of the second facet mirror 121, the individual first facets 120 are imaged into the object field 104. The second facet mirror 121 is the last beam-shaping mirror or else, in fact, the last mirror for the illumination radiation 115 in the beam path upstream of the object field 104.

In a further embodiment, not shown, of the illumination optical unit 103, a transfer optical unit contributing in particular to the imaging of the first facets 120 into the object field 104 can be arranged in the beam path between the second facet mirror 121 and the object field 104. The transfer optical unit can have exactly one mirror or else alternatively two or more mirrors, which are arranged one behind the other in the beam path of the illumination optical unit 103. In particular, the transfer optical unit can comprise one or two mirrors for normal incidence (NI mirror, "normal incidence" mirror) and/or one or two mirrors for grazing incidence (GI mirror, "grazing incidence" mirror).

In the embodiment shown in FIG. 1, the illumination optical unit 103 comprises exactly three mirrors downstream of the collector 116, specifically the deflection mirror 118, the field facet mirror 119 and the pupil facet mirror 121.

The deflection mirror 118 can also be dispensed with in a further embodiment of the illumination optical unit 103, and so the illumination optical unit 103 can then have exactly two mirrors downstream of the collector 116, specifically the first facet mirror 119 and the second facet mirror 121.

The imaging of the first facets 120 into the object plane 105 via the second facets 122 or using the second facets 122 and a transfer optical unit is, as a rule, only approximate imaging.

The projection optical unit 109 comprises a plurality of mirrors Mi, which are numbered in accordance with their arrangement in the beam path of the EUV projection exposure apparatus 100.

In the example illustrated in FIG. 1, the projection optical unit 109 comprises six mirrors M1 to M6. Alternatives with four, eight, ten, twelve or any other number of mirrors Mi are similarly possible. The penultimate mirror M5 and the last mirror M6 each have a through opening for the illumination radiation 115. The projection optical unit 109 is a double-obscured optical unit. The projection optical unit 109 has an image-side numerical aperture which is greater than 0.5 and which can also be greater than 0.6 and, for example, be 0.7 or 0.75.

Reflection surfaces of the mirrors Mi can be embodied as free-form surfaces without an axis of rotational symmetry. Alternatively, the reflection surfaces of the mirrors Mi can be designed as aspherical surfaces with exactly one axis of rotational symmetry of the reflection surface shape. Just like the mirrors of the illumination optical unit 103, the mirrors Mi can have highly reflective coatings for the illumination radiation 115. These coatings can be designed as multilayer coatings, in particular with alternating layers of molybdenum and silicon.

The projection optical unit 109 has a large object-image offset in the y-direction between a y-coordinate of a center of the object field 104 and a y-coordinate of the center of the image field 110. In the y-direction, this object-image offset can be of approximately the same magnitude as a z-distance between the object plane 105 and the image plane 111.

In particular, the projection optical unit 109 can have an anamorphic form. In particular, it has different imaging scales βx, βy in the x- and y-directions. The two imaging scales βx, βy of the projection optical unit 109 are optionally (βx, βy)=(+/−0.25, +/−0.125). A positive imaging scale β means imaging without image inversion. A negative sign for the imaging scale β means imaging with image inversion.

The projection optical unit 109 consequently leads to a reduction in size with a ratio of 4:1 in the x-direction, that is to say in a direction perpendicular to the scanning direction.

The projection optical unit 109 leads to a reduction in size of 8:1 in the y-direction, that is to say in the scanning direction.

Other imaging scales are similarly possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 104 and the image field 110 can be the same or, depending on the embodiment of the projection optical unit 109, can differ. Examples of projection optical units with different numbers of such intermediate images in the x- and y-directions are known from US 2018/0074303 A1.

In each case one of the pupil facets 122 is assigned to exactly one of the field facets 120 for forming in each case an illumination channel for illuminating the object field 104. In particular, this can yield illumination according to the Köhler principle. The far field is decomposed into a multiplicity of object fields 104 with the aid of the field facets 120. The field facets 120 produce a plurality of images of the intermediate focus on the pupil facets 122 respectively assigned thereto.

By way of respectively assigned pupil facets 122, the field facets 120 are imaged onto the reticle 106 in a manner superposed on one another for the purposes of illuminating the object field 104. The illumination of the object field 104 is in particular as homogeneous as possible. It optionally has a uniformity error of less than 2%. Field uniformity can be attained by overlaying different illumination channels.

The illumination of the entrance pupil of the projection optical unit 109 can be defined geometrically by way of an arrangement of the pupil facets. The intensity distribution in the entrance pupil of the projection optical unit 109 can be set by selecting the illumination channels, in particular the subset of the pupil facets which guide light. This intensity distribution is also referred to as illumination setting.

A likewise preferred pupil uniformity in the region of sections of an illumination pupil of the illumination optical unit 103 which are illuminated in a defined manner can be achieved by a redistribution of the illumination channels.

Further aspects and details of the illumination of the object field 104 and in particular of the entrance pupil of the projection optical unit 109 are described below.

In particular, the projection optical unit 109 can have a homocentric entrance pupil. The latter can be accessible. It can also be inaccessible.

The entrance pupil of the projection optical unit 109 cannot, as a rule, be exactly illuminated using the pupil facet mirror 121. In the case of imaging of the projection optical unit 109 which telecentrically images the center of the pupil facet mirror 121 onto the wafer 112, the aperture rays often do not intersect at a single point. However, it is possible to find an area in which the distance of the aperture rays determined in pairs becomes minimal. This area represents the entrance pupil or an area in real space that is conjugate thereto. In particular, this area has a finite curvature.

It may be the case that the projection optical unit 109 has different positions of the entrance pupil for the tangential beam path and for the sagittal beam path. In this case, an imaging element, in particular an optical component of the transfer optical unit, should be provided between the second facet mirror 121 and the reticle 106. With the aid of this optical component, it is possible to take account of the different relative positions of the tangential entrance pupil and the sagittal entrance pupil.

In the arrangement of the components of the illumination optical unit 103 illustrated in FIG. 1, the pupil facet mirror 121 is arranged in an area conjugate to the entrance pupil of the projection optical unit 109. The first field facet mirror 119 is arranged so as to be tilted in relation to the object plane 105. The first facet mirror 119 is arranged so as to be tilted in relation to an arrangement plane defined by the deflection mirror 118.

The first facet mirror 119 is arranged in tilted fashion with respect to an arrangement plane defined by the second facet mirror 121.

Figure 2:
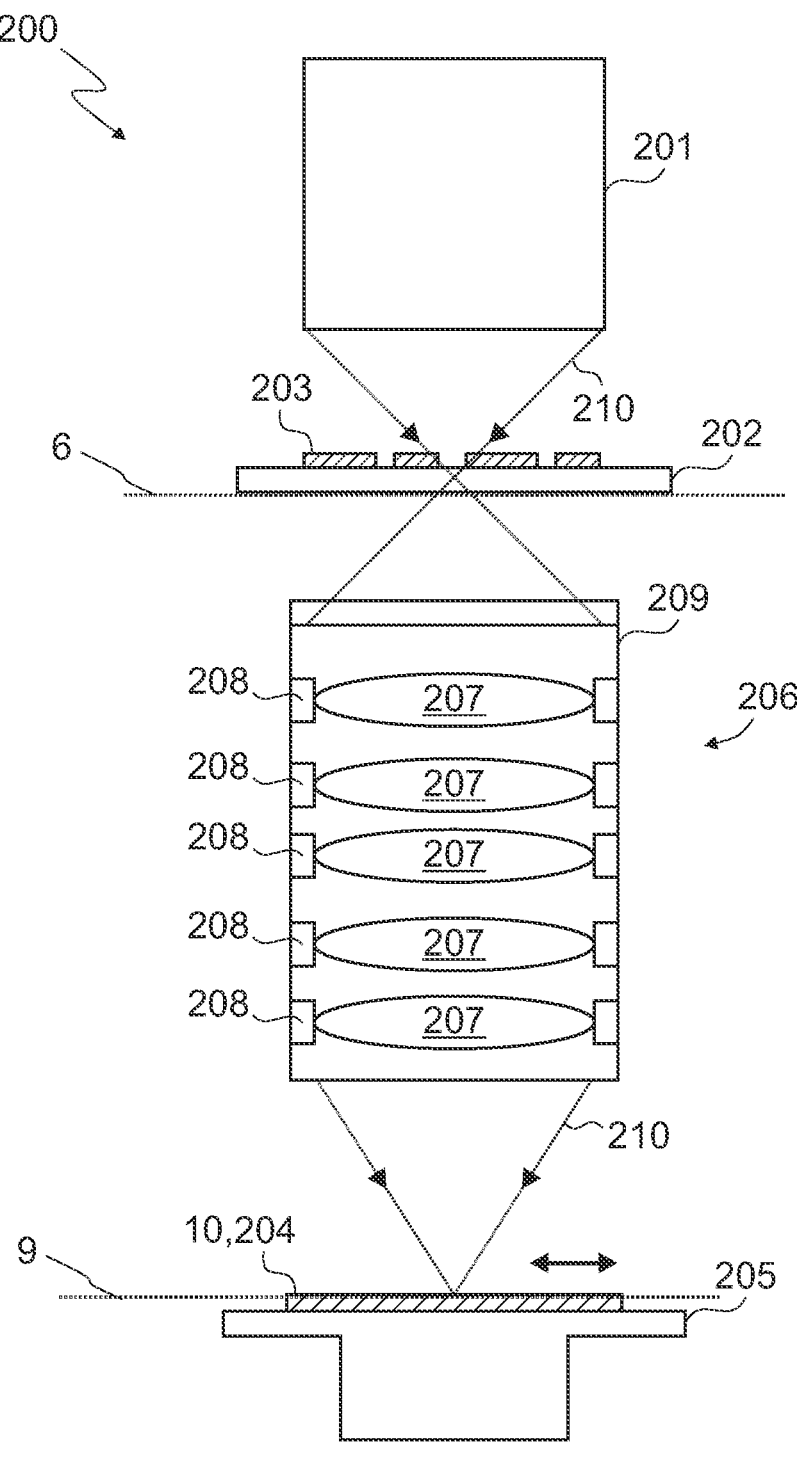
FIG. 2 shows a DUV projection exposure apparatus.

FIG. 2 illustrates an exemplary DUV projection exposure apparatus 200. The DUV projection exposure apparatus 200 comprises an illumination system 201, a device known as a reticle stage 202 for receiving and exactly positioning a reticle 203, by which the later structures on a wafer 204 are determined, a wafer holder 205 for holding, moving and exactly positioning the wafer 204 and an imaging device, specifically a projection optical unit 206, with a plurality of optical elements, in particular lens elements 207, which are held by way of mounts 208 in a lens housing 209 of the projection optical unit 206.

As an alternative or in addition to the lens elements 207 illustrated, provision can be made of various refractive, diffractive and/or reflective optical elements, inter alia, also mirrors, prisms, terminating plates and the like.

The basic functional principle of the DUV projection exposure apparatus 200 makes provision for the structures introduced into the reticle 203 to be imaged onto the wafer 204.

The illumination system 201 provides a projection beam 210 in the form of electromagnetic radiation, which is used for the imaging of the reticle 203 on the wafer 204. A laser, a plasma source or the like can be used as the source of this radiation. The radiation is shaped in the illumination system 201 via optical elements such that the projection beam 210 has the desired properties with regard to diameter, polarization, shape of the wavefront and the like when it is incident on the reticle 203.

An image of the reticle 203 is generated via the projection beam 210 and transferred from the projection optical unit 206 onto the wafer 204 in an appropriately reduced form. In this case, the reticle 203 and the wafer 204 can be moved synchronously, so that regions of the reticle 203 are imaged onto corresponding regions of the wafer 204 virtually continuously during a so-called scanning process.

An air gap between the last lens element 207 and the wafer 204 can optionally be replaced by a liquid medium which has a refractive index of greater than 1.0. The liquid medium can be high-purity water, for example. Such a structure is also referred to as immersion lithography and has an increased photolithographic resolution.

The use of the disclosure is not restricted to use in projection exposure apparatuses 100, 200, in particular also not with the described structure. The disclosure is suitable for any lithography system, but in particular for projection exposure apparatuses having the described structure. The disclosure is also suitable for EUV projection exposure apparatuses which have a smaller image-side numerical aperture that those described in the context of FIG. 1, and which have no obscured mirror(s) M5 and/or M6. In particular, the disclosure is also suitable for EUV projection exposure apparatuses which have an image-side numerical aperture from 0.25 to 0.5, such as 0.3 to 0.4, for example 0.33. The disclosure and the following exemplary embodiments should also not be understood as being restricted to a specific design. The following figures merely show the disclosure by way of example and highly schematically.

FIG. 3 shows a schematic representation of a sectional view through a possible embodiment of an optical apparatus 1 according to the disclosure.

The optical apparatus 1 for a lithography system, in particular for projection exposure apparatus 100, 200, optionally as depicted in FIGS. 1 and 2, comprises at least one optical element 2 which has an optical surface 3, and one or more actuators 4 for deforming the optical surface 3. The optical element 2 further comprises a strain gauge device 5 for determining the deformation of the optical surface 3.

In the exemplary embodiment depicted in FIG. 3, the strain gauge device 5 is configured to determine a strain of at least one measurement region 6 of the optical element 2. In this case, the at least one measurement region 6 is arranged in such a way that a strain of the measurement region 6 is determined by a deformation of the optical surface 3.

In particular, the optical surface 3 and the measurement region 6 are mechanically coupled in the depicted exemplary embodiment.

Furthermore, FIG. 3 shows an embodiment of the optical apparatus 1, in which the strain gauge device 5 comprises at least one path length device 7 for producing a measurement spectrum 8 (see FIG. 9) of a measurement radiation 9.

Further, in the exemplary embodiment depicted in FIG. 3 of the optical apparatus 1, the optical element 2 comprises a substrate element 10 on which the optical surface 3 is arranged or formed. Further, the strain gauge device 5 is partly arranged within the substrate element 10.

In an alternative embodiment, not depicted here, provision can be made for the strain gauge device 5 to be arranged completely in and/or on the substrate element 10.

Further, FIG. 3 shows an embodiment of the optical apparatus 1 in which the strain gauge device 5 comprises both at least one waveguide 11 and the path length devices 7. The path length device 7 is in the form of a grating device 7a in the depicted exemplary embodiment. A plurality of path length devices 7, each optionally embodied as a grating device 7a, are provided in the exemplary embodiment.

In particular, in the exemplary embodiment depicted in FIG. 3, the strain gauge device 5 comprises at least one waveguide 11 and a plurality of path length devices 7, with the at least one waveguide 11 guiding the measurement radiation 9 to the plurality of path length devices 7 in succession.

FIG. 3 further shows a type of embodiment of the optical apparatus 1 in which the at least one grating device 7a optionally is in the form of a fiber Bragg grating 7b.

Further, the at least one waveguide 11 in the exemplary embodiment is optionally in the form of an optical fiber 11a.

Further, a closed-loop control device 12 with optionally a closed loop is provided in the exemplary embodiment depicted in FIG. 3, in order to set a target strain of the measurement region 6 via the at least one actuator 4. An actual strain of the measurement region 6 determined by the strain gauge device 5 is taken into account in this adjustment.

In this exemplary embodiment, the closed-loop control device 12 is further configured for the purposes of setting a target deformation of the optical surface 3 via the actuators 4, with the actual strain of the measurement region 6 determined by the strain gauge device being taken into account.

Furthermore, in the depicted exemplary embodiment, the closed-loop control device 12 is configured to correct at least one temperature-induced and/or strain-induced deviation of the actual deformation from the target deformation of the optical surface 3.

Moreover, FIG. 3 shows an embodiment type of the optical apparatus 1, in which a plurality of measurement regions 6 are arranged on the optical element 2 in such a way deformations of the optical surface 3 that are relevant to an optical effect caused by the optical element 2 are measurable.

Moreover, in the exemplary embodiment of the optical apparatus 1 depicted in FIG. 3, a computing device 13 is present to determine an actual deformation of the optical surface 3 and a suitable force of the at least one actuator 4 for setting a target deformation of the optical surface 3 from the determined actual strain of the at least one measurement region 6.

Further, in the depicted exemplary embodiment, each actuator 4 is assigned a respective measurement region 6 which virtually exclusively comprises an effective region 14 of the respective actuator 4.

Further, in the depicted exemplary embodiment of FIG. 3, the optical apparatus 1 is configured in such a way that the strain of the at least one measurement region 6 and/or vibrations of the optical surface 3 are regularly determinable, in particularly determinable with a high-frequency and hence approximately continuously, by way of the strain gauge device 5.

Moreover, in the exemplary embodiment depicted in FIG. 3, the plurality of measurement regions 6 are arranged on and in the optical element 2 in such a way that one or more vibration modes of the optical surface 3 and of the optical element 2 are determinable.

The optical apparatus 1 depicted in FIG. 3 is particularly suitable for carrying out a method for setting the target deformation of the optical surface 3.

Further, the path length device 7 comprises a grating device 7a for the measurement radiation 9.

Figure 8:
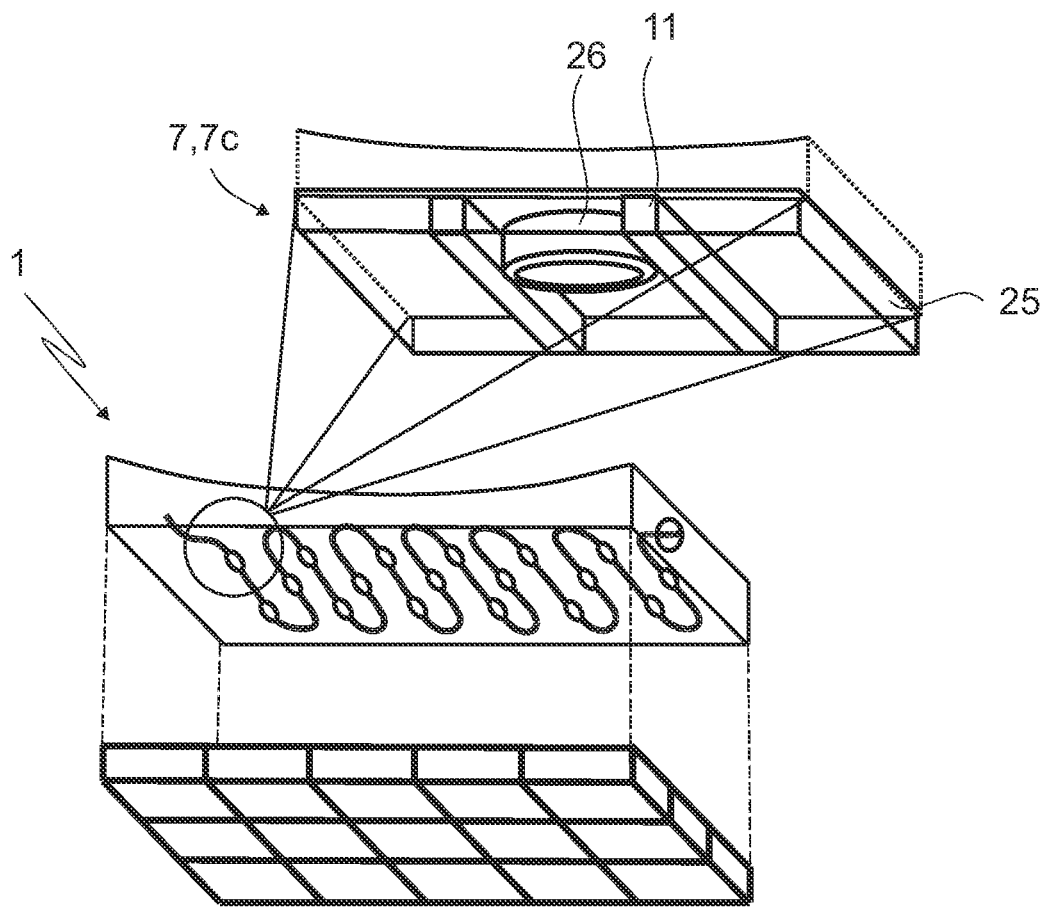
FIG. 8 shows a schematic representation of an isometric view of a possible embodiment of a path length device of the optical apparatus according to the disclosure in an enlarged representation.

The exemplary embodiment of the optical apparatus 1 depicted in FIG. 8 is particularly suitable for carrying out an embodiment type of the method, according to which the path length device 7 is formed by a resonator device 7c.

FIG. 3A shows a block diagram-like representation of the method.

In the method for setting the target deformation of the optical surface 3 of the optical element 2 for the lithography system, in particular the projection exposure apparatus 100, 200, via one or more actuators, provision is made for the at least one actual strain of the at least one measurement region 6 of the optical element 2 to be determined in a strain determination block 15 and, as a result, for the actual deformation of the optical surface 3 to be determined in a deformation determination block 16.

Further, the at least one measurement region 6 is chosen in a selection block 17 in the exemplary embodiment of the method depicted in FIG. 3A, in such a way that the actual deformation of the optical surface 3 can be deduced in the deformation determination block 16 from the actual strain. The effect of the selection block 17 on the deduction is elucidated by a dashed line, which leads to an arrow between the strain determination block 15 and the deformation determination block 16.

In the exemplary embodiment of the method depicted in FIG. 3A, provision is made for the actual strain of the at least one measurement region 6 and vibrations of the optical surface 3 to be determined regularly, in particular at a high frequency and optionally at least approximately continuously, by way of the strain gauge device 5 in the strain determination block 15 and/or the deformation determination block 16.

Further, provision is made for one or more vibration modes of the optical surface 3 and/or of the optical element 2 to be determined in the strain determination block 15 and/or the deformation determination block 16.

Furthermore, provision is made in the depicted exemplary embodiment for the actual strain to be determined synchronously in a plurality of measurement regions 6 in the strain determination block 15.

To this end, provision is made, in particular, for the actual strain to be determined in one or more measurement regions 6 in the at least one substrate element 10 underlying the optical surface 3.

Further, in the exemplary embodiment of the method depicted in FIG. 3A, provision is made for a force determination block 18 in order to determine a force of the at least one actuator 4 used to set, in an adjustment block 19, the target deformation of the optical surface 3 from the actual deformation of the optical surface 3 determined in the deformation determination block 16.

In particular, provision is made in the depicted exemplary embodiment for a field strength of an electric field to be applied to the at least one actuator 4 to be determined in the force determination block 18.

According to the depicted exemplary embodiment, the force determined in the force determination block 18 is applied by the at least one actuator 4.

Further, a closed loop is provided from the adjustment block 19 to the strain determination block 15 in the exemplary embodiment depicted in FIG. 3A. In the exemplary embodiment depicted in FIG. 3A, the closed loop is elucidated by an arrow with a solid line. The control loop is closed by virtue of an effect in fact obtained by the adjustment block 19 being measured by the strain determination block 15.

Starting at the strain determination block 15, a new setting in the adjustment block 19 can be implemented in turn via the force determination block 18 and the deformation determination block 16. Accordingly, the closed loop can be run through any desired number of times, optionally in regular fashion, in order to obtain a sought-after target deformation of the optical surface 3.

The exemplary embodiment of the optical apparatus 1 depicted in FIG. 3 is particularly suitable for a way of implementing the method, according to which the strain gauge device 5 is arranged in such a way that the at least one measurement spectrum 8 is influenced by the actual strain of the at least one measurement region 6 in the at least one path length device 7.

A spectrometer device 20 is provided in the exemplary embodiment depicted in FIG. 3 for the purposes of measuring the at least one measurement spectrum 8.

By way of example, the spectrometer device 20 can be used to determine the actual strain by detecting the at least one measurement spectrum 8 of the at least one measurement radiation 9, which is optionally broadband in the exemplary embodiment.

Alternatively or in addition, provision can be made for a narrowband measurement radiation 9 to be coupled into the waveguide 11 and for the at least one measurement spectrum 8 to be determined in a scanning method by sweeping or scanning a sufficiently broad wavelength band.

In the process, the measurement radiation 9 is formed by a broadband measurement radiation source (not depicted here).

Figure 3B:
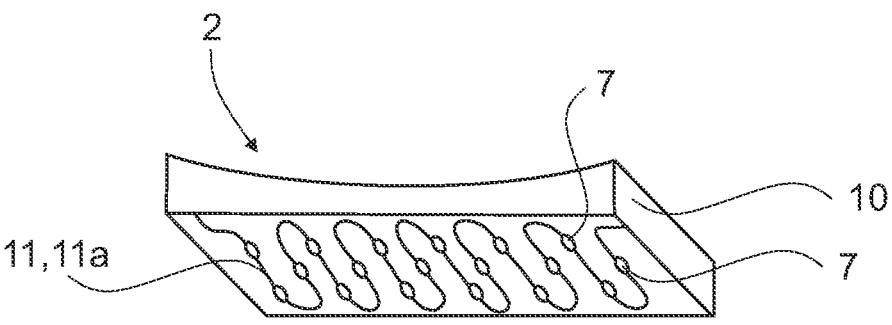
FIG. 3B shows a schematic representation of a possible embodiment of an optical element of the optical apparatus according to the disclosure.

FIG. 3B shows an isometric back view of the optical element 2, with the strain gauge device 5 comprising an optical fiber 11a and a plurality of path length devices 7, the optical fiber 11a successively guiding the measurement radiation 9 to the plurality of path length devices 7.

In the exemplary embodiment depicted in FIG. 3B, the optical fiber 11a is guided in loops in the substrate element 10.

In the depicted exemplary embodiment, the measurement regions 6 of the path length devices 7 are arranged in the substrate element 10.

In a further exemplary embodiment, not depicted here, the optical fiber 11a may be replaced by a different waveguide 11, for example by a light channel.

Figure 4:
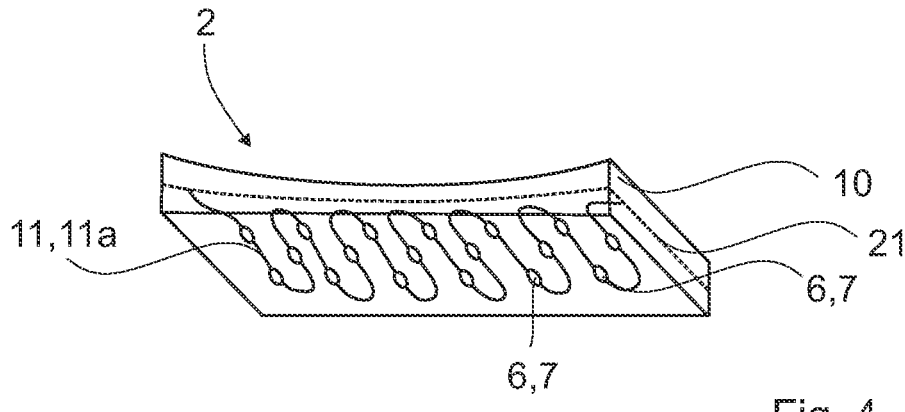
FIG. 4 shows a schematic representation of a further possible embodiment of an optical element of the optical apparatus according to the disclosure.

FIG. 4 shows an isometric back view of a further possible embodiment of the optical element 2 of the optical apparatus 1.

In the depicted exemplary embodiment, the measurement regions 6 of the path length devices 7 are arranged in a strain-neutral plane 21 of the substrate element 10.

Figure 5:
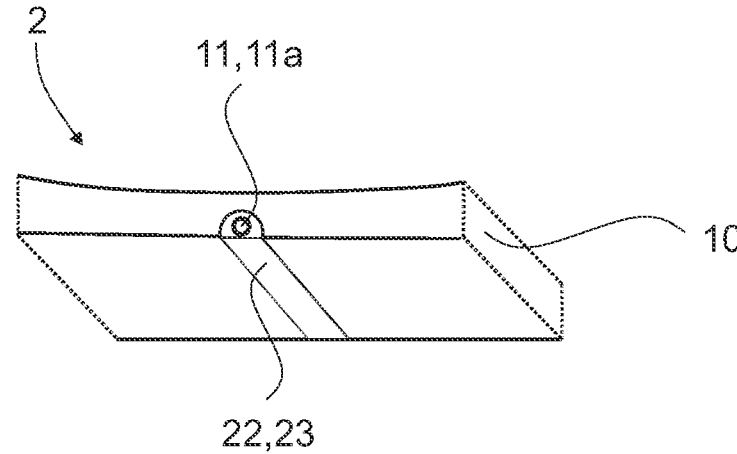
FIG. 5 shows a schematic representation of a further possible embodiment of an optical element of the optical apparatus according to the disclosure.

FIG. 5 shows a schematic representation of a section of the optical element 2, with the waveguide 11 or the optical fiber 11a being integrated in the substrate element 10. In this case, the optical fiber 11a or the waveguide 11 has been inserted into a groove 22 and optionally embedded in a soldering glass 23, and has consequently been virtually monolithically connected to the substrate element 10.

In particular, provision is made here for the optical fiber 11a to be freed from a plastic coating, or for the latter to be removed, prior to embedding in the soldering glass 23.

Figure 6:
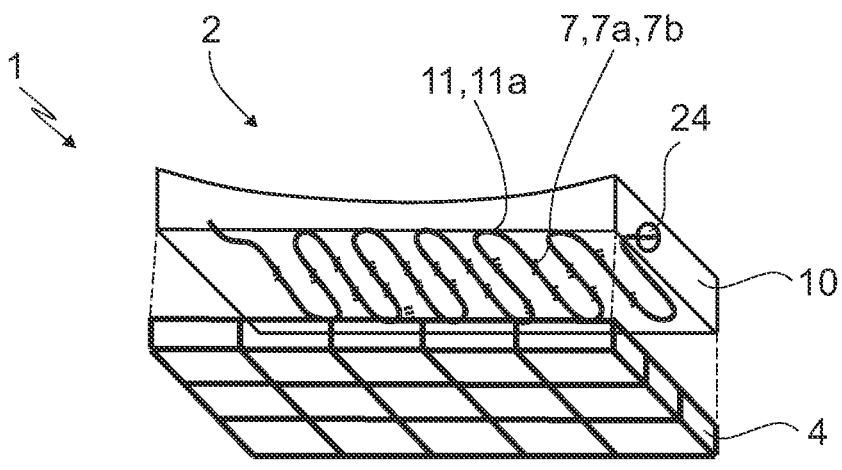
FIG. 6 shows a schematic representation of an isometric view of a possible embodiment of the optical apparatus according to the disclosure.

FIG. 6 shows a schematic representation of an isometric back view of the optical apparatus 1. For better visibility, the actuators 4 and the optical element 2 are represented in the style of an exploded drawing, symbolized by dashed lines.

Once again, the waveguide 11 or the optical fiber 11a is guided through the substrate element 10 in snaking or looping or meandering fashion. In this case, the waveguide 11 or the optical fiber 11a successively leads to the path length devices 7, which are formed as grating devices 7a and, in particular, as fiber Bragg gratings 7b in the depicted exemplary embodiment. The waveguide 11 is connectable to the spectrometer device 20, not depicted in FIG. 6, by way of a connection device 24.

Figure 7:
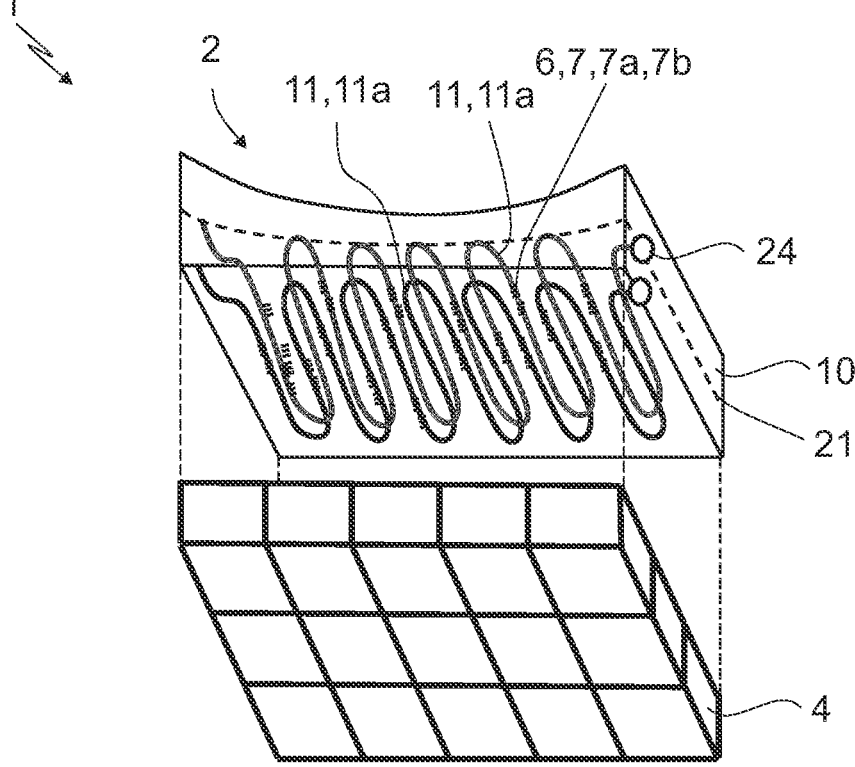
FIG. 7 shows a schematic representation of an isometric view of a further possible embodiment of the optical apparatus according to the disclosure.

FIG. 7 shows a schematic representation of an isometric back view of a further possible embodiment of the optical apparatus 1. For better visibility, the actuators 4 and the optical element 2 are represented in the style of an exploded drawing, symbolized by dashed lines. In the actual embodiment, the actuators 4 are connected in mechanically coupled fashion to the optical element 2 and, in particular, the substrate element 10.

In the exemplary embodiment depicted in FIG. 7, a plurality of waveguides 11 or fibers 11a are provided.

In the exemplary embodiment depicted in FIG. 7, a plurality of measurement regions 6 of the strain gauge device 5 are formed at different depths in the substrate element 10 and at least one of the plurality of measurement regions 6 is arranged in the strain-neutral plane 21 of the substrate element 10.

The embodiment of the optical apparatus 1 depicted in FIG. 7 is particularly suitable for carrying out a type of embodiment of the method according to which the respective actual strain in the plurality of measurement regions 6 is determined at different depths of the substrate element 10 and the actual strain in at least one of the plurality of measurement regions 6 is determined in the strain-neutral plane 21 of the substrate element 10.

FIG. 8 shows a further schematic representation of the optical apparatus 1, with a section of the path length device 7 being depicted in enlarged fashion. With respect to the representation of the optical apparatus 1, in particular reference is made to the embodiment of FIG. 6.

In the exemplary embodiment depicted in FIG. 8, the path length device 7 comprises a resonator device 7c for the measurement radiation 9, and a plurality of waveguides 11.

In the illustrated exemplary embodiment, the resonator device 7c is formed in a filling layer 25, a silicon oxide filling layer for a plane surface in the exemplary embodiment. Further, the resonator device 7c comprises a ring resonator 26.

Figure 9:
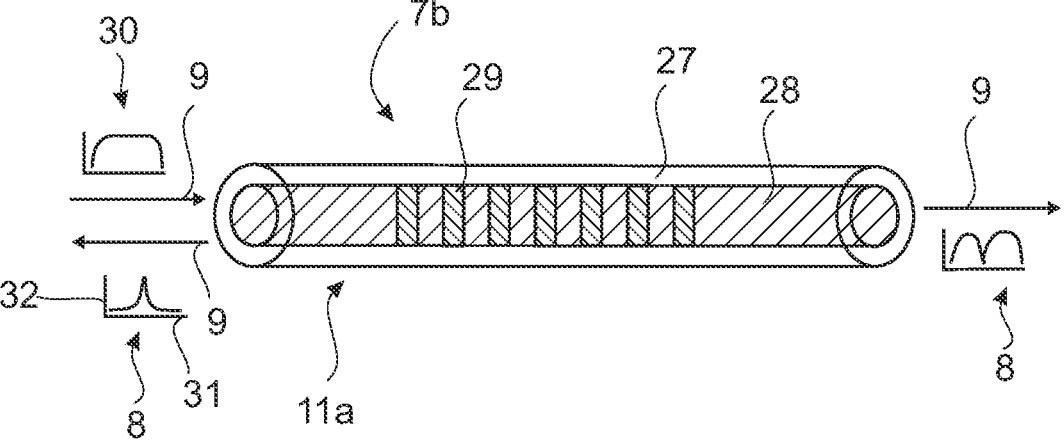
FIG. 9 shows a schematic representation of a possible embodiment of a grating device.

FIG. 9 shows a schematic representation of a fiber Bragg grating 7b in an optical fiber 11a.

In this case, the optical fiber 11a is formed from a cladding 27, a core 28 and line grating regions 29 arranged in the core 28. Here, the line grating regions 29 have a different refractive index to the core 28.

On a left-hand side, the measurement radiation 9 is coupled into the optical fiber 11a and guided by the optical fiber 11a to the fiber Bragg grating 7b. A part of the measurement radiation 9 is reflected back at the fiber Bragg grating while another part of the measurement radiation 9 is transmitted through the fiber Bragg grating 7b.

The directions of propagation of the measurement radiation 9 are elucidated by arrows.

The arising measurement spectra 8 are assigned to the respective arrows.

In the measurement spectra 8 and in a likewise depicted input coupling spectrum 30, with which the measurement radiation 9 is coupled into the fiber 11a, a wavelength is plotted on a horizontal wavelength axis 31. The intensity of the measurement radiation 9 in the respective spectral region is plotted on a vertical intensity axis 32.

It is evident here that when the measurement radiation 9 with the broadband input coupling spectrum 30 is coupled in, the reflected measurement spectrum 8 only has a narrow peak while the transmitted measurement spectrum 8 has a narrow notch. The notch in the transmitted measurement spectrum 8 emerges from the reflection of a portion of the measurement radiation 9. Accordingly, the two measurement spectra 8 complement one another to form the input coupling spectrum 30.

Provision can be made for a line grating gap 29a to be formed in such a way that there is a phase offset of pi between the individual parts of the measurement radiation 9. By way of example, a Fabry-Pérot cavity can be formed in this way. Provision can be made for the line grating gap 29a to be formed in such a way that a sharp notch arises with a full width at half maximum of 1 GHz to 3 GHz, optionally 2 GHz in a frequency space.

FIG. 10 shows a schematic representation of possible measurement spectra 8. The wavelengths are plotted along the wavelength axis 31 while a reflectivity of the path length device is plotted on a reflectivity axis 33 (cf., the reflected component of the measurement radiation 9 in FIG. 9 in this respect).

FIG. 11 shows a schematic representation of an exemplary embodiment of the fiber Bragg grating 11b analogous to FIG. 9.

In this case, the line grating regions 29 have different refractive indices from one another, which is elucidated by hatching of differing closeness. The refractive indices of the line grating regions 29 differ from the refractive index of the core 28 in this case. The reflected measurement spectrum arises as depicted below the fiber Bragg grating 7b, with analogous axis labeling to FIG. 9.

As a result of the refractive index variation among the line grating regions 29 depicted in FIG. 11, it is possible for example to suppress secondary maxima in the measurement spectrum 8.

FIG. 12 shows a schematic representation of a further possible embodiment of the fiber Bragg grating 7b.

In this case, the line grating regions 29 are arranged in the core 28 in groups, the groups being spaced apart from one another. The spacing is chosen such that the components of the measurement radiation 9 reflected by the individual groups have a phase offset of pi. As a result, there is destructive interference of these components of the measurement radiation 9 and in the representation of the measurement spectrum 8, which is shown below the line grating region 29, a notch is visible in the reflected spectrum in the region in which the highest reflectivity is to be expected.

This is advantageous in that the observable notch is sharper than a plateau of the reflected measurement radiation 8 (see FIG. 11) and consequently can be detected with greater precision.

Such an embodiment of the fiber Bragg grating 7b may also be referred to as a pi fiber Bragg grating.

Figure 13:
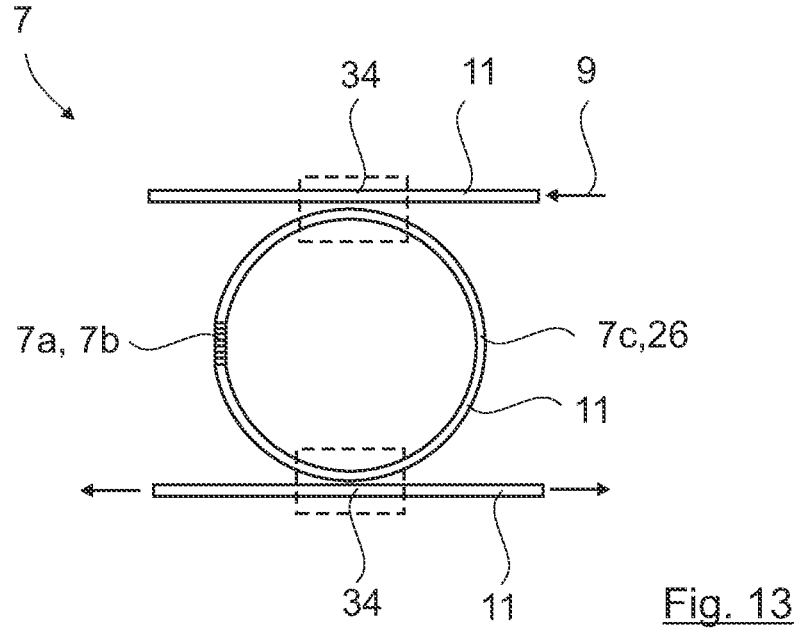
FIG. 13 shows a schematic representation of a possible embodiment of a resonator device.

FIG. 13 shows a schematic representation of a further embodiment of the path length device 7.

In this case, the measurement radiation 9 is fed into the waveguide 11 and coupled into the resonator device 7c, formed as a ring resonator 26, in a coupling device 34. In the depicted exemplary embodiment, the ring resonator 26 itself comprises a waveguide 11, in which the measurement radiation 9 is fed to the grating device 7a. Measurement radiation 9 reflected and/or transmitted by the grating device 7a is output coupled, once again into a waveguide 11, by way of a further coupling device 34 and can be examined with respect to the transmitted measurement spectrum 8 or the reflected measurement spectrum 8 on different sides of the waveguide 11.

In particular, provision can be made for the grating device 7a to be formed as a fiber Bragg grating 7b and in particular as a pi fiber Bragg grating.

Figure 14:
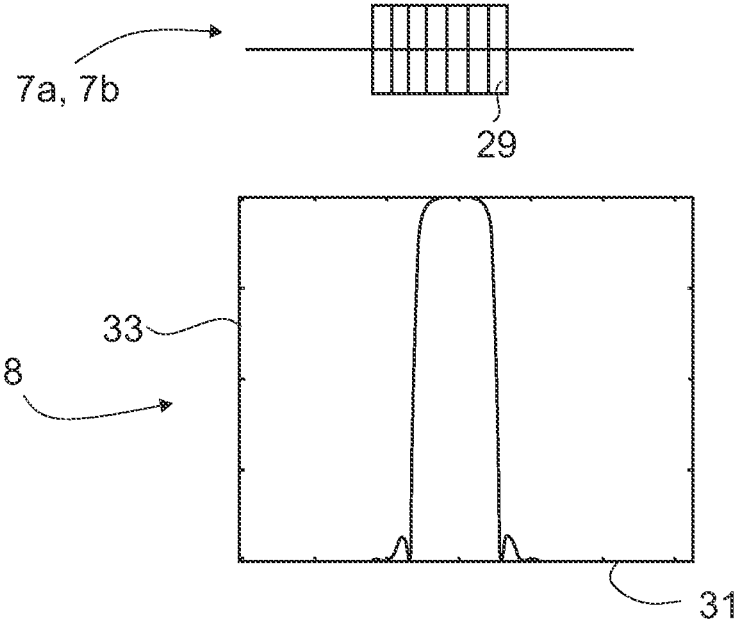
FIG. 14 shows a further schematic representation of an embodiment of a grating device.

FIG. 14 shows a further schematic representation of a reflected measurement spectrum 8 of the grating device 7a, in a manner analogous to the representation in FIG. 11.

FIG. 15 shows a further schematic representation of a reflected measurement spectrum 8 of a fiber Bragg grating 7b in an embodiment as a pi fiber Bragg grating, in a manner analogous to the representation in FIG. 12.

FIG. 16 shows a schematic representation of an embodiment of the resonator device 7c. The resonator device 7c in turn comprises a ring resonator 26. A diameter of the ring resonator 26 is elucidated by a double-head arrow. A waveguide 11, through which light can be coupled into the ring resonator 26 and/or output coupled therefrom, leads along the ring resonator 26.

Under the representation of the resonator device 7*c*, FIG. 16 depicts a schematic transmitted measurement spectrum 8 which arises due to the ring resonator 7*c*. Sharp notches arise at multiples of a wavelength of the measurement radiation 9. The distance between the sharp notches is determined by a geometry and/or the diameter of the ring resonator 26. The notches move together or apart if there is a change in the geometry of the ring resonator 26. If the distances between the notches are measured, it is possible to deduce the diameter and/or the geometry of the ring resonator 7*c*.

Alternatively or in addition, provision can be made for a position or phase, optionally an absolute position or phase, of one or more of the notches to be measured in the measurement spectrum 8. As a result, the diameter and/or the geometry of the ring resonator 7*c* can be deduced particularly reliably and precisely.

Figure 17:
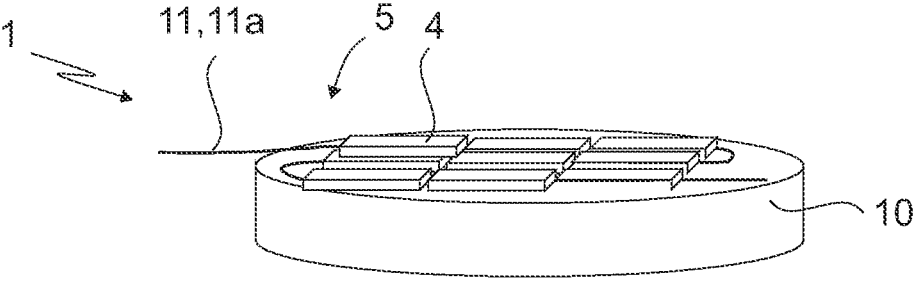
FIG. 17 shows a schematic representation of an isometric view of a possible embodiment of the optical apparatus according to the disclosure.

FIG. 17 shows an oblique view of a schematic representation of a possible embodiment of the optical apparatus 1.

In this case, the optical fiber 11*a* is soldered into the substrate element 10 via the soldering glass 23.

Figure 18:
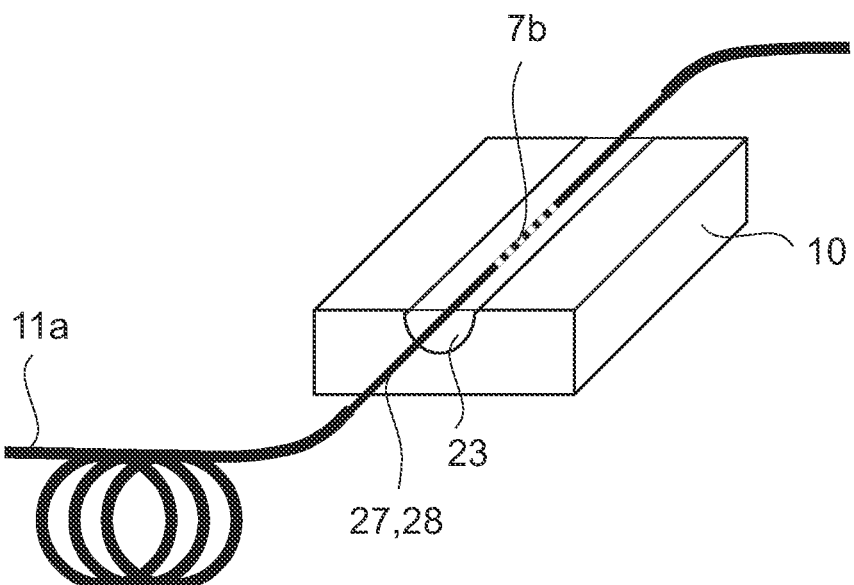
FIG. 18 shows a schematic representation of a possible integration of the strain gauge device in an optical element of the optical apparatus according to the disclosure.

FIG. 18 shows a further exemplary embodiment of the integration of the optical fiber 11*a* into the substrate element 10, with the core 28 and the cladding 27 of the optical fiber once again being soldered into the substrate element 10 via the soldering glass 23. In this case, the fiber Bragg grating 7*b* is arranged in the groove 22 in the soldering glass 23 in the substrate element 10.

A protective coating (not depicted) and/or a sleeve (not depicted), for example a polymer sleeve, which may surround the core 28 and the cladding 27 were removed in the soldered region since high temperatures may lead to the protective coating and/or the sleeve being damaged.

Provision can be made for the soldering glass 23 to be processed at a temperature of 200° C. to 500° C., optionally 350° C. to 450° C., while the core 28 and/or the cladding 27 of the optical fiber 11*a* optionally have a melting temperature of 1500° C. to 1800° C.

Provision can optionally be made for a refractive index variation of the core 28 not to be damaged as a result of high temperature when melting down or soldering.

In this case, provision can be made for femtosecond-written grating devices 7*a* and/or fiber Bragg gratings 7*b* to be exposed to a temperature of less than 1100° C., such as less than 900° C., for example less than 800° C. when melting down or soldering.

Provision can be made for the femtosecond-written grating devices 7*a* and/or fiber Bragg gratings 7*b* to be heat resistant up to a temperature of at least 800° C., such as at least 900° C., for example at least 1100° C. at least when melting down or soldering.

Further, provision can be made for UV-written grating devices 7*a* and/or fiber Bragg gratings 7*b* to be exposed to a temperature of less than 800° C., optionally less than 500° C. when melting down or soldering.

Provision can be made for the UV-written grating devices 7*a* and/or fiber Bragg gratings 7*b* to be heat resistant up to a temperature of at least 500° C., optionally at least 800° C. at least when melting down or soldering.

Figure 19:
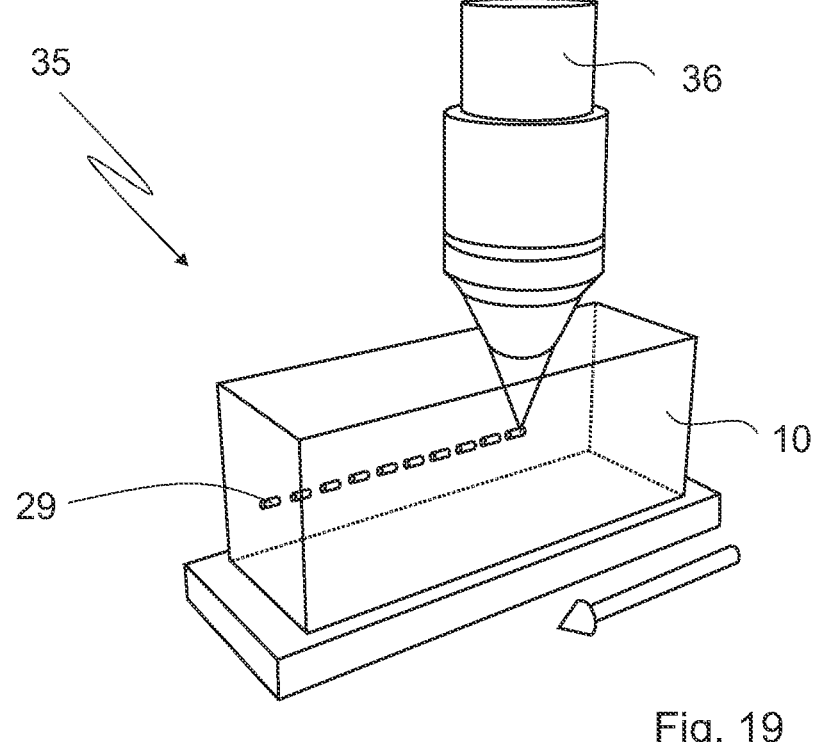
FIG. 19 shows a schematic representation of a possible production process of the strain gauge device.

FIG. 19 shows a possible embodiment of an apparatus 35 for producing an optical apparatus 1. In particular, the optical apparatus 1 can be produced in such a way by the apparatus 35 that the at least one waveguide 11 and/or the at least one grating device 7*a* and/or the at least one resonator device 7*c* is formed by the substrate element 10.

The depicted apparatus 35 is configured to write refractive index variations into an initial material of the substrate element 10 by way of high-energy write radiation 36. By varying the radiation intensity of the write radiation 36 it is possible to set a variation of the refractive index for the purposes of forming the line grating device 29. As a result, it is possible to write the strain gauge device 5 or parts of the strain gauge device 5 directly into the substrate element 10 and/or the optical surface 3.

The optical apparatus 1 is particularly suitable for an optical element which is formed as mirror M4 and/or M5 of the EUV projection exposure apparatus 100 according to FIG. 1.

Features mentioned in an exemplary embodiment of FIGS. 3 to 19 can also be implemented in the other exemplary embodiments. In particular, it is also possible to use a plurality of optical fibers which are arranged in the optical element 2 in the manner described on the basis of FIGS. 5, 6, 7, 18 and/or 19.

The embodiments described in the context of the optical apparatus 1 and/or the method according to the disclosure can also be seen as disclosure for the production method for the optical element 2 according to the disclosure.

LIST OF REFERENCE SIGNS

1 Optical apparatus
2 Optical element
3 Optical surface
4 Actuator
5 Strain gauge device
6 Measurement region
7 Path length device
7*a* Grating device
7*b* Fiber Bragg grating
7*c* Resonator device
8 Measurement spectrum
9 Measurement radiation
10 Substrate element
11 Waveguide
11*a* Optical fiber
12 Closed-loop control device
13 Computing device
14 Effective region
15 Strain determination block
16 Deformation determination block
17 Selection block
18 Force determination block
19 Adjustment block
20 Spectrometer device
21 Strain-neutral plane
22 Groove
23 Soldering glass
24 Connection device
25 Filling layer
26 Ring resonator
27 Cladding
28 Core
29 Line grating region
29*a* Line grating gap
30 Input coupling spectrum
31 Wavelength axis
32 Intensity axis
33 Reflectivity axis
34 Coupling device
35 Apparatus
36 Writing radiation
100 EUV projection exposure apparatus
101 Illumination system
102 Radiation source

37

103 Illumination optical unit
104 Object field
105 Object plane
106 Reticle
107 Reticle holder
108 Reticle displacement drive
109 Projection optical unit
110 Image field
111 Image plane
112 Wafer
113 Wafer holder
114 Wafer displacement drive
115 EUV/used/illumination radiation
116 Collector
117 Intermediate focal plane
118 Deflection mirror
119 First facet mirror/field facet mirror
120 First facets/field facets
121 Second facet mirror/pupil facet mirror
122 Second facets/pupil facets
200 DUV projection exposure apparatus
201 Illumination system
202 Reticle stage
203 Reticle
204 Wafer
205 Wafer holder
206 Projection optical unit
207 Lens element
208 Mount
209 Lens housing
210 Projection beam
Mi Mirrors

What is claimed is:

1. An optical apparatus, comprising:
a mirror, comprising:
   a substrate element;
   an optical surface supported by the substrate element; and
   a strain gauge device;
an actuator configured to deform the optical surface; and
a closed-loop control device,
wherein:
   the strain gauge device comprises: i) a path length device configured to generate a measurement spectrum of a measurement radiation; and ii) a waveguide configured to guide the measurement radiation to the path length device;
   the path length device comprises a grating device configured to measure the measurement radiation and/or a resonator device configured to measure the measurement radiation;
the strain gauge device is configured to determine an actual strain in a measurement region of the mirror based on an actual deformation of the optical surface;
the path length device is at least partly arranged in the substrate element;
the waveguide is at least partially arranged in the substrate element;
the closed-loop control device comprises a closed loop configured to set a target strain of the measurement region via the actuator taking into account the actual strain of the measurement region determined by the strain gauge device;
the closed-loop control device is configured to correct a temperature-induced deviation of the actual deformation of the optical surface from a target deformation of the optical surface and/or a strain-induced deviation of the actual deformation of the optical surface from the target deformation of the optical surface; and
the substrate element comprises $SiO_2$—$TiO_2$ glass.
2. The optical apparatus of claim 1, wherein the strain gauge device is at least partly arranged within the measurement region.
3. The optical apparatus of claim 1, wherein the strain gauge device comprises a plurality of path length devices, and the waveguide is configured to guide the measurement radiation to the plurality of path length devices.
4. The optical apparatus of claim 1, wherein the grating device comprises a fiber Bragg grating.
5. The optical apparatus of claim 1, wherein at least one of the following holds:
   the optical apparatus comprises a plurality of measurement regions at different depths in the substrate element; and
   the measurement region is in a strain-neutral plane of the substrate element.
6. The optical apparatus of claim 1, wherein the closed-loop control device is configured to set the target deformation of the optical surface via the actuator taking into account the actual strain of the measurement region determined by the strain gauge device.
7. The optical apparatus of claim 1, wherein the measurement region comprises a plurality of measurement regions on the mirror configured so that deformations of the optical surface that are relevant to an optical effect caused by the mirror are measurable.
8. The optical apparatus of claim 1, further comprising a computing device configured to determine an actual deformation of the optical surface and/or a suitable force of the actuator to set the target deformation of the optical surface from the actual strain of the measurement region.
9. The optical apparatus of claim 1, comprising a plurality of actuators and a plurality of measurement regions, each actuator assigned to a measurement region which comprises an effective region of the respective actuator.
10. The optical apparatus of claim 1, wherein the strain gauge device is configured to regularly determine the strain of the measurement region and/or vibrations of the optical surface.
11. The optical apparatus of claim 1, wherein one or more measurement regions are arranged on and/or in the mirror so that one or more vibration modes of the optical surface and/or of the mirror are determinable.
12. An apparatus, comprising:
a radiation source;
an optical unit comprising the optical apparatus of claim 1,
   wherein the apparatus is a semiconductor lithography projection exposure apparatus.
13. The optical apparatus of claim 1, wherein the optical apparatus is a projection objective comprising at least five mirrors along a beam path through the projection objective, and the mirror is a fourth mirror along the beam path through the projection objective.
14. The optical apparatus of claim 1, wherein the optical apparatus is a projection objective comprising at least five mirrors along a beam path through the projection objective, and the mirror is a fifth mirror along the beam path through the projection objective.
15. The optical apparatus of claim 1, wherein the path length device comprises a resonator device.
16. A method for setting a target deformation of an optical surface of a mirror for a lithography system via one or more actuators, the method comprising:

determining an actual deformation of the optical surface
by virtue of at least one actual strain of at least one
measurement region of the mirror,
wherein:
the at least one measurement region is configured so
that the actual deformation of the optical surface is
deducible from the actual strain;
the actual strain is determined in one or more measure-
ment regions in at least one substrate element sup-
porting the optical surface;
the respective actual strain in a plurality of measure-
ment regions is determined at different depths in the
substrate element, and/or the actual strain is deter-
mined in a strain-neutral plane of the substrate
element in at least one of a plurality of measurement
regions; and
the substrate element comprises $SiO_2$—$TiO_2$ glass.

17. The method of claim 16, further comprising deter-
mining and/or applying a force of the at least one actuator to
set a target deformation of the optical surface, based on the
determined actual deformation of the optical surface.

18. A production method for a mirror of a lithography
system, the mirror comprising a substrate element and an optical surface that is supported by the substrate element, the
optical surface being deformable via an actuator, the mirror
comprising a strain gauge device configured to determine a
deformation of the optical surface, the strain gauge device
comprising a path length device configured to generate a
measurement spectrum of a measurement radiation, the
strain gauge device further comprising a waveguide config-
ured to guide the measurement radiation to the path length
device, the path length device comprising a grating device
for the measurement radiation and/or a resonator device for
the measurement radiation, the method comprising:
using a local change in a refractive index to direct write
the strain gauge device in the substrate element,
wherein the substrate element comprises $SiO_2$—$TiO_2$
glass.

19. The method of claim 18, wherein direct writing the
strain gauge device comprises using laser pulses having a
duration of from one femtosecond to 15 femtoseconds.

20. The method of claim 19, wherein the laser pulses are
in the ultraviolet spectral range.

* * * * *